United States Patent
Gorodnitsky et al.

(10) Patent No.: US 10,686,465 B2
(45) Date of Patent: *Jun. 16, 2020

(54) LOW BIT RATE SIGNAL CODER AND DECODER

(71) Applicants: Irina Gorodnitsky, Albuquerque, NM (US); Anton Yen, San Francisco, CA (US)

(72) Inventors: Irina Gorodnitsky, Albuquerque, NM (US); Anton Yen, San Francisco, CA (US)

(73) Assignee: Luce Communications, Albuquerque, NM (US)

(*) Notice: Subject to any disclaimer, the term of this patent is extended or adjusted under 35 U.S.C. 154(b) by 34 days.

This patent is subject to a terminal disclaimer.

(21) Appl. No.: 16/044,329

(22) Filed: Jul. 24, 2018

(65) Prior Publication Data

US 2018/0358981 A1 Dec. 13, 2018

Related U.S. Application Data

(63) Continuation of application No. 13/882,195, filed as application No. PCT/US2011/058479 on Oct. 28, 2011, now Pat. No. 10,084,475, which is a continuation-in-part of application No. 12/915,989, filed on Oct. 29, 2010, now Pat. No. 8,620,660.

(51) Int. Cl.
*H03M 7/30* (2006.01)
*G10L 19/00* (2013.01)
*G10L 19/08* (2013.01)

(52) U.S. Cl.
CPC ............... *H03M 7/30* (2013.01); *G10L 19/00* (2013.01); *G10L 19/08* (2013.01)

(58) Field of Classification Search
None
See application file for complete search history.

(56) References Cited

U.S. PATENT DOCUMENTS

| | | | | |
|---|---|---|---|---|
| 6,108,621 A * | 8/2000 | Nishiguchi | ............. | G10L 19/08 704/207 |
| 8,620,660 B2 * | 12/2013 | Yen | ......................... | G10L 19/00 704/258 |
| 10,084,475 B2 * | 9/2018 | Gorodnitsky | ........... | H03M 7/30 |
| 2013/0159005 A1 * | 6/2013 | Kikuiri | .................... | G10L 19/00 704/500 |
| 2013/0214943 A1 * | 8/2013 | Yen | ......................... | G10L 19/00 341/50 |

* cited by examiner

*Primary Examiner* — Kaveh Abrishamkar

(57) ABSTRACT

An improved mixed oscillator-and-external excitation model and methods for estimating the model parameters, for evaluating model quality, and for combining it with known in the art methods are disclosed. The improvement over existing oscillators allows the model to receive, as an input, all except the most recent point in the acquired data. Model stability is achieved through a process which includes restoring unavailable to the decoder data from the optimal model parameters and by using metrics to select a stable restored model output. The present invention is effective for very low bit-rate coding/compression and decoding/decompression of digital signals, including digitized speech, audio, and image data, and for analysis, detection, and classification of signals. Operations can be performed in real time, and parameterization can be achieved at a user-specified level of compression.

8 Claims, 6 Drawing Sheets

LOW BIT RATE SIGNAL CODER AND DECODER

CROSS-REFERENCE TO RELATED APPLICATIONS

The present application is a continuation of and claims priority to U.S. patent application Ser. No. 13/882,195 filed Apr. 28, 2013, titled "Low Bit Rate Signal Coder and Decoder," the entire contents of which are incorporated herein by reference for all purposes. U.S. patent application Ser. No. 13/882,195 is a U.S. National Stage Entry of international patent application No. PCT/US2011/058479 filed Oct. 28, 2011, titled "Low Bit Rate Signal Coder and Decoder," which claims priority from U.S. patent application Ser. No. 12/915,989 filed Oct. 29, 2010, titled "Very Low Bit Rate Signal Coder and Decoder," now U.S. Pat. No. 8,620,660.

REFERENCE TO SEQUENCE LISTING, A TABLE, OR A COMPUTER PROGRAM APPENDIX

Not applicable.

COPYRIGHT NOTICE

A portion of the disclosure of this patent document contains material that is subject to copyright protection. The copyright owner has no objection to the facsimile reproduction by anyone of the patent document or patent disclosure as it appears in the Patent and Trademark Office, patent file or records, but otherwise reserves all copyright rights whatsoever.

FIELD OF THE INVENTION

One or more embodiments of the invention generally relate to the field of signal and data modeling, compression/decompression (lossless and lossy), coding/decoding, and analysis such as detection and classification. More particularly, one or more embodiments of the invention relate to an excitation model, and based on it, systems for obtaining new signal models.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, an aspect of the prior art generally useful to be aware of is that one goal in signal analysis and modeling is to represent the information as efficiently as possible with as few parameters as possible. This is useful for example, in signal detection and classification. Signal coding, which also may be referred to as compression, has a similar objective, which is to minimize the number of parameters, typically represented by bits, being stored or communicated, thus increasing efficiency of storing, distributing, and transmitting the information. The process of transforming a source sequence into a set of model parameters is called encoding and restoring is referred to as decoding. Therefore, the same methods can be applied to either signal modeling or coding. However, a coder is assumed to be used in combination with a second process, a decoder which reconstructs the signal from its coded parameters. Hence, for methodological purposes, coding can be viewed as a technique that encompasses modeling as part of its process.

Typically, in encoding, an input signal is divided into intervals, often called frames, sections, or events. Each frame can be transformed by windowing and/or filtering, and possibly other operations, to obtain a windowed/filtered/transformed frame. Standard oscillator models transform a current data frame into a small set of parameters consisting of delays or pointers and weight coefficients associated with them. The pointers reference fixed-lengths blocks in a buffer containing a restored version of the earlier acquired data frames. The restoration of a frame takes place once its model parameters have been estimated, and the restored frame is kept in memory, creating a sequence of historical data that represents a restored version of the input sequence. The blocks of these historic data are chosen so that their weighted sum provides the 'best match' to the current data frame, where 'best match' may be defined, in many typical applications, as the one which minimizes the mean squared error between the current frame and its model. In this way, an input signal is replaced by a set of integer address codes pointing to the match locations and the multiplier coefficients associated with weights of the match data blocks.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that one limitation of the classical oscillators, also called self-excited models, for example the self-excited vocoder (SEV), is the delineation they make between the previously modeled frames of data and the current frame being modeled, in that the data in the current frame does not participate in deriving the model parameters for that frame. This approach works well for modeling source patterns that re-occur on a time scale that exceeds at least one frame length. Thus, traditional oscillators may be considered to be methods for modeling long scale structures in data.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art is that typical modern coders may employ multiple models to encode the different scales in the source patterns. For instance, the Adaptive Multi-Rate (AMR) family of codecs used in mobile telecommunications typically utilize three models in tandem, first a linear predictor (LP) for modeling short scale patterns, followed by an "adaptive codebook" (AC), which is an improved SEV-like model that can encode mid-to-long scale structures, and finally a third model, which encodes the residual remaining after the first two models have been applied. The AC model in AMR improves on the traditional SEV by allowing some limited section of data from the current input frame to be used for modeling that data. This extends the range of structures that one can model with AC to mid-to-long scale structures. However, this improvement still may not allow modeling of all source scales, which is why LP is used prior to AC in AMR.

It is typical when modeling signals in current art, to separate data into different scales or components and model those components individually. An input may be split into frequency bands, wavelets, or other types of waveforms so that these components can be coded separately, generating multiple sets of parameters for each frame. Referring back to speech coding, another example of this is a family of coders called the Multiband Excitation (MBE, IMBE, and AMBE), which divide an input signal into frequency bands, based on voiced/unvoiced characteristics of each band, and encode the individual bands separately.

Coding a single frame in a form of multiple models or components means that the frame is represented by the corresponding multiple sets of coding parameters, each typically assigned a fixed coding budget. Encoding signals with multiple sets of parameters may not be efficient if a comparable modeling quality can be achieved with a smaller, single set of parameters. The need to represent signals efficiently in a small set of parameters in order to extract information, maximize transmission rates, and to minimize memory in storage systems, all motivate development of the more efficient coding technologies.

In view of the foregoing, it is clear that these traditional techniques are not perfect and leave room for more optimal approaches.

BRIEF DESCRIPTION OF THE DRAWINGS

The present invention is illustrated by way of examples, and not by way of limitation, in the figures of the accompanying drawings and in which like reference numerals refer to similar elements and in which.

Figure 1:
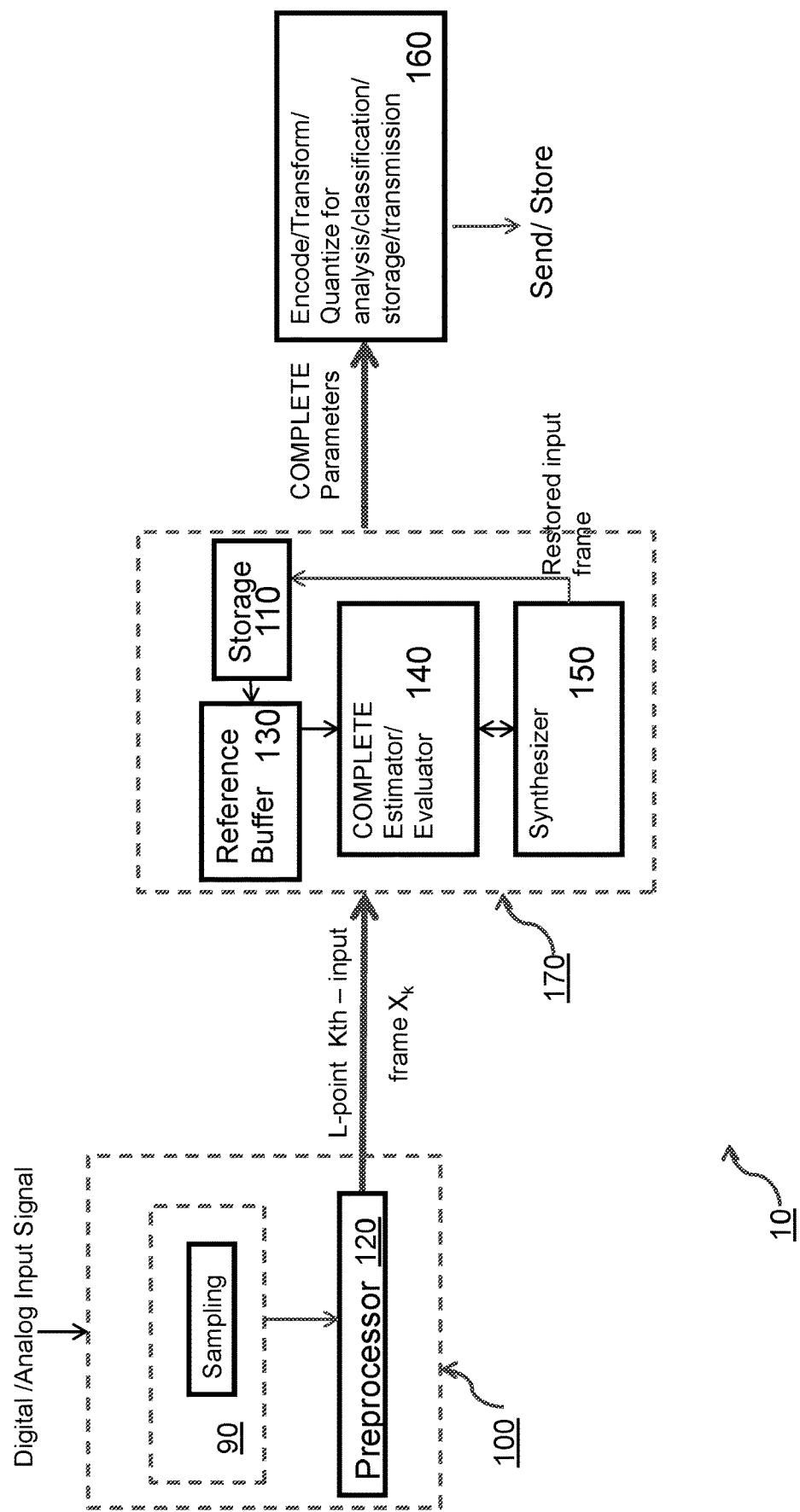
FIG. 1 illustrates an exemplary a block diagram depicting three basic components of the COMPLETE-based analysis/coding system, in accordance with an embodiment of the present invention.

Unless otherwise indicated illustrations in the figures are not necessarily drawn to scale.

DETAILED DESCRIPTION OF SOME EMBODIMENTS

Embodiments of the present invention are best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will now be described in detail with reference to embodiments thereof as illustrated in the accompanying drawings.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a micro-computer; a server; a client; an interactive television; a web appliance; a telecommunications device with internet access; a hybrid combination of a computer and an interactive television; a portable computer; a tablet personal computer (PC); a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, a system on a chip, or a chip set; a data acquisition device; an optical computer; a quantum computer; a biological computer; and generally, an apparatus that may accept data, process data according to one or more stored software programs, generate results, and typically include input, output, storage, arithmetic, logic, and control units.

"Software" may refer to prescribed rules to operate a computer. Examples of software may include: code segments in one or more computer-readable languages; graphical and or/textual instructions; applets; pre-compiled code; interpreted code; compiled code; and computer programs.

A "computer-readable medium" may refer to any storage device used for storing data accessible by a computer. Examples of a computer-readable medium may include: a magnetic hard disk; a floppy disk; an optical disk, such as a CD-ROM and a DVD; a magnetic tape; a flash memory; a memory chip; and/or other types of media that can store machine-readable instructions thereon.

A "computer system" may refer to a system having one or more computers, where each computer may include a computer-readable medium embodying software to operate the computer or one or more of its components. Examples of a computer system may include: a distributed computer system for processing information via computer systems linked by a network; two or more computer systems connected together via a network for transmitting and/or receiving information between the computer systems; a computer system including two or more processors within a single computer; and one or more apparatuses and/or one or more systems that may accept data, may process data in accordance with one or more stored software programs, may generate results, and typically may include input, output, storage, arithmetic, logic, and control units.

A "network" may refer to a number of computers and associated devices that may be connected by communication facilities. A network may involve permanent connections such as cables or temporary connections such as those made through telephone or other communication links. A network may further include hard-wired connections (e.g., coaxial cable, twisted pair, optical fiber, waveguides, etc.) and/or wireless connections (e.g., radio frequency waveforms, free-space optical waveforms, acoustic waveforms, etc.). Examples of a network may include: an internet, such as the Internet; an intranet; a local area network (LAN); a wide area network (WAN); and a combination of networks, such as an internet and an intranet.

Exemplary networks may operate with any of a number of protocols, such as Internet protocol (IP), asynchronous transfer mode (ATM), and/or synchronous optical network (SONET), user datagram protocol (UDP), IEEE 802.x, etc.

Embodiments of the present invention may include apparatuses for performing the operations disclosed herein. An apparatus may be specially constructed for the desired purposes, or it may comprise a general-purpose device selectively activated or reconfigured by a program stored in the device.

Embodiments of the invention may also be implemented in one or a combination of hardware, firmware, and software. They may be implemented as instructions stored on a machine-readable medium, which may be read and executed by a computing platform to perform the operations described herein.

In the following description and claims, the terms "computer program medium" and "computer readable medium" may be used to generally refer to media such as, but not limited to, removable storage drives, a hard disk installed in hard disk drive, and the like. These computer program products may provide software to a computer system. Embodiments of the invention may be directed to such computer program products.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, and as may be apparent from the following description and claims, it should be appreciated that throughout the specification descriptions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In a similar manner, the term "processor" may refer to any device or portion of a device that processes electronic data from registers and/or memory to transform that electronic data into other electronic data that may be stored in registers and/or memory. A "computing platform" may comprise one or more processors.

A non-transitory computer readable medium includes, but is not limited to, a hard drive, compact disc, flash memory, volatile memory, random access memory, magnetic memory, optical memory, semiconductor based memory, phase change memory, optical memory, periodically refreshed memory, and the like; however, the non-transitory computer readable medium does not include a pure transitory signal per se.

In the interest of efficiency, some embodiments of the invention will be referred to here as a coder/decoder, with the understanding that the coding part is equally applicable to signal and data modeling and analysis. Further, the term compression is often associated with coding discrete memoryless sources—where any existing pattern in the source evolution is treated statistically rather than in a model form. Some embodiments of present invention are at least useful with regard to the type of coding where a data sequence evolves according to some quantifiable rule, and more specifically, useful to obtaining a model—a closed form representation of this rule.

A practical embodiment of the present invention is to model/encode as much of the signal information as possible using one parsimonious model, so as to replace as much as possible the multiple sets of parameters used for encoding in the current art. Many practical embodiments decode information back with as much fidelity as possible. In many practical embodiments, the modeling method, termed the Complete Oscillator Plus External Excitation (COMPLETE), improves on the current models, in that it may account simultaneously for all scales in the source pattern as well as random features in the data, thus enabling users in many cases to apply a single highly efficient model in place of multiple models used in the existing art. In many practical embodiments, COMPLETE improves on the standard oscillator models as follows. In addition to using the earlier acquired frames, it also enables one to use all the data in the current input frame, except the last point, in modeling that frame. A key challenge that must be solved when using the input frame in the model is that these data are not available for restoring the frame to the decoder. Typically, in the current art, including AC in AMR, decoders replace these unavailable data with data from the preceding frames. This may not be optimal since the discrepancy in data between adjacent frames can be substantial in many types of signals, including speech. Many practical embodiments of the present invention improve on this aspect by reconstructing unavailable data at the decoder point-by-point from the derived model parameters. Reconstructing data rather than substituting them from earlier frames improves the accuracy of the decoded signal as compared to the current art and this, in turn, improves the stability of the oscillator, which, in turn, enables the invention to use the novel maximum range of data from the current frame. Nevertheless, even with improved accuracy in estimating the unavailable data as is enabled by the invention, the reconstructed frame may not be equal to the modeled signal. The discrepancy between the restored and the modeled input signal may accumulate with each subsequent frame being modeled and eventually lead to model instability. When the maximal number of data points from the current input is allowed to be used for modeling that input and the entire input content may be encoded with such a model, as provided by this invention, the discrepancy that leads to model instability can grow rapidly, quickly making the model unstable. This is one challenge solved in many practical embodiments of the invention, which ensure model stability by evaluating multiple candidate reconstructed frames during the model estimation process. The standard model fitting methods are extended in the embodiments to incorporate multiple evaluation metrics, which among other functions, ensures model stability. Further, the use of such methods in the present embodiment of the invention, which make it possible to estimate stable models, also enable embodiments that extend the 'self-excited' model structure to include excitations which are distinct from the earlier modeled frames. Incorporating these excitations, called external excitations, enables to model nonrecurring features in the data and this further extends the modeling capability of the present embodiment of the invention.

In many practical embodiments, the COMPLETE model is not equivalent to a combination of various existing short and long-scale models. Rather, the resulting COMPLETE representations are distinct from any existing models. Furthermore, using COMPLETE to comprehensively capture the entire signal structure at once leads to very parsimonious models with far fewer parameters than the total required for separate short and long-scale models in existing art. Due to this efficiency, a wide range of various signal classes can be modeled with high accuracy according to the invention, some with as few as two model terms. Many practical embodiments of COMPLETE pertain to lossy coding of signals that may contain noise and nonstationary features. Further, some embodiments of the invention may provide lossless coding for completely deterministic sources that evolve according to a continuously defined dynamic rule. It should be noted that many signal classes contain both short and long scale patterns.

Oscillators, by definition, use redundancies in the structure of the acquired data to develop a model. Thus, oscillators are generally considered poorly suited for modeling transient features, such as isolated events, discontinuities, and noise-like features, that are not well defined in the acquired data patterns. Speech is one example of fast changing signal in which the ratio between semi-oscillatory and noise-like energy can change abruptly. In many practical embodiments, the COMPLETE model can be robust to some such conditions considered unfavorable for typical oscillators, for example in the presence of colored noise and certain transients, with the degree of COMPLETE robustness being determined by the complexity of the specific chosen functional form of the COMPLETE model and the specific embodiment of the external excitation vectors. Nevertheless, the performance of COMPLETE can diminish when such unfavorable conditions are pronounced. The potential loss of performance is not desirable in applications in which a certain level of performance must be met. Many practical embodiments of the invention constitute systems that combine COMPLETE with the known in the art methods (KAMs), for the purpose of reaching the desired level of performance of a COMPLETE-based coder or improving coding efficiency of a KAM. Another utility of such multimodal COMPLETE/KAM systems according to the present embodiment of invention is to provide initialization for COMPLETE.

In many practical embodiments the innovations to apply the above principles encompass the following: an improved excitation model that extends the range of model references to include a mixture of information derived from data history, the maximal causal range of data from the current input, additional information derived by the system from sources other than data history, and a dictionary of predetermined waveforms; innovative methods for estimating such models that can employ multiple metrics and several different types of model outputs for the purposes of selecting the optimal model and ensuring stability of the model; improved methods for decoding signals that reconstruct the unavailable reference data using the model parameters derived from that data; methods and systems for combining at least some embodiment of the invention with known in the art methods that can be used to initialize COMPLETE and to enhance efficiency of COMPLETE and/or existing coding/compression methods; and a sample speech coder/decoder realized from these innovations, as detailed next.

In many practical embodiments, methods for modeling and encoding an input frame use an improved range of model references. In addition to the typical use of the reconstructed earlier modeled frames and in some cases, a part of the data from the current frame, all the data from the current input frame, except for the very last point, are used as internal excitation input. This allows the short- and long-scale patterns in the source to be encoded by one comprehensive source model. Further, in addition to internal excitations typically used in the oscillator model, external excitations that are not part of the previously acquired frames are included as possible model references. The external excitation vectors enable one to model unstructured features in data as well as recently emerged structures. External excitations can also be used to initialize the COMPLETE model. The mixture of internal and external references allows one to model with a single parsimonious code complex signals that contain multi-scale patterns as well as unstructured features.

In many practical embodiments, generally, methods are provided for estimating the parameters of such complete oscillator models and for restoring (decoding) signals from such parameters which use an innovative process of reconstructing unavailable model references point-by-point during both, model estimation (the evaluation stage) and decoding.

In many practical embodiments, innovative methods for evaluating the quality of the COMPLETE model expand the range of metric options that can be used to estimate the best model tailored to a specific application. Further, a multi-step process is provided for evaluating a single model using multiple metrics. In addition, the expanded range of metrics is applied to different model outputs, including the output that is restored from the model parameters without using data from the current input frame. A key aspect of this improvement comes from the fact that such restored frame may not be equal to the frame model used to estimate its parameters. The restored model output used in evaluation helps ensure stability of the COMPLETE model across frames.

In many practical embodiments, methods are provided for using known in the art methods (KAMs) to initialize COMPLETE operations.

In many practical embodiments, methods and systems are provided for selecting between COMPLETE and KAMs and/or for combining COMPLETE with one or more KAM models for the purpose of encoding an individual frame. The various systems that implement such selection are developed by extending methods used for evaluating the performance of the COMPLETE candidate models.

In at least one embodiment, a method and system for speech coding/decoding is provided based on a multimodal COMPLETE/KAM system.

Mode 1: The COMPLETE Coder/Decoder System

FIG. 1 illustrates an exemplary block diagram depicting three basic components of the COMPLETE-based analysis/coding system, in accordance with an embodiment of the present invention. FIG. 1 shows a diagram of the basic blocks of a Complete Oscillator PLus External Excitation (COMPLETE) based encoding system 10. COMPLETE 10 can contain a preprocessor 120, which builds an L-sample input frame and which can transform an input, for example by windowing and filtering. The preprocessing operations can also include an optional analog sampling, performed in unit 90, which can convert an analog input into a digital signal. COMPLETE 10 can further includes COMPLETE generator module 170, which is the main COMPLETE code generating module; and a postprocessor 160 which can organize/store/send the derived code parameters, and which can also analyze/transform these parameters. Input can be a signal evolving in time or a spatial vector, such as a data sequence extracted from a 2-D image. Digital or analog input can be supplied to the preprocessing module in FIG. 1. Analog inputs can be first sampled in unit 90 prior to being passed to preprocessor 120, while digital signal inputs can be directly received by preprocessor 120.

Preprocessor 120 can output a frame $X_k$ containing L samples of the input signal according to the Equation $X_k=[x(n-L+1), \ldots, x(n)]$, where $x(n-L+1)$ refers to the first data point in the frame, $x(n)$ refers to the last data point in the frame. The subscript 'k' refers to the order in which the frame was acquired. Throughout the description, the subscript 'k' will indicate the current frame $X_k$ being modeled, and the subscript 'k–s', where 's' is an integer value, will refer to the frame acquired 's' frames prior to the current frame. Preprocessor 120 can also filter, window, or otherwise transform an input frame, using known methods that would be appropriate for the application. Further, overlapping frames $X_k$ may be created, where some part of data from the preceding frame $X_{k-1}$ is retained in preprocessor 120 and used to make a part of the current frame $X_k$.

Figure 2:
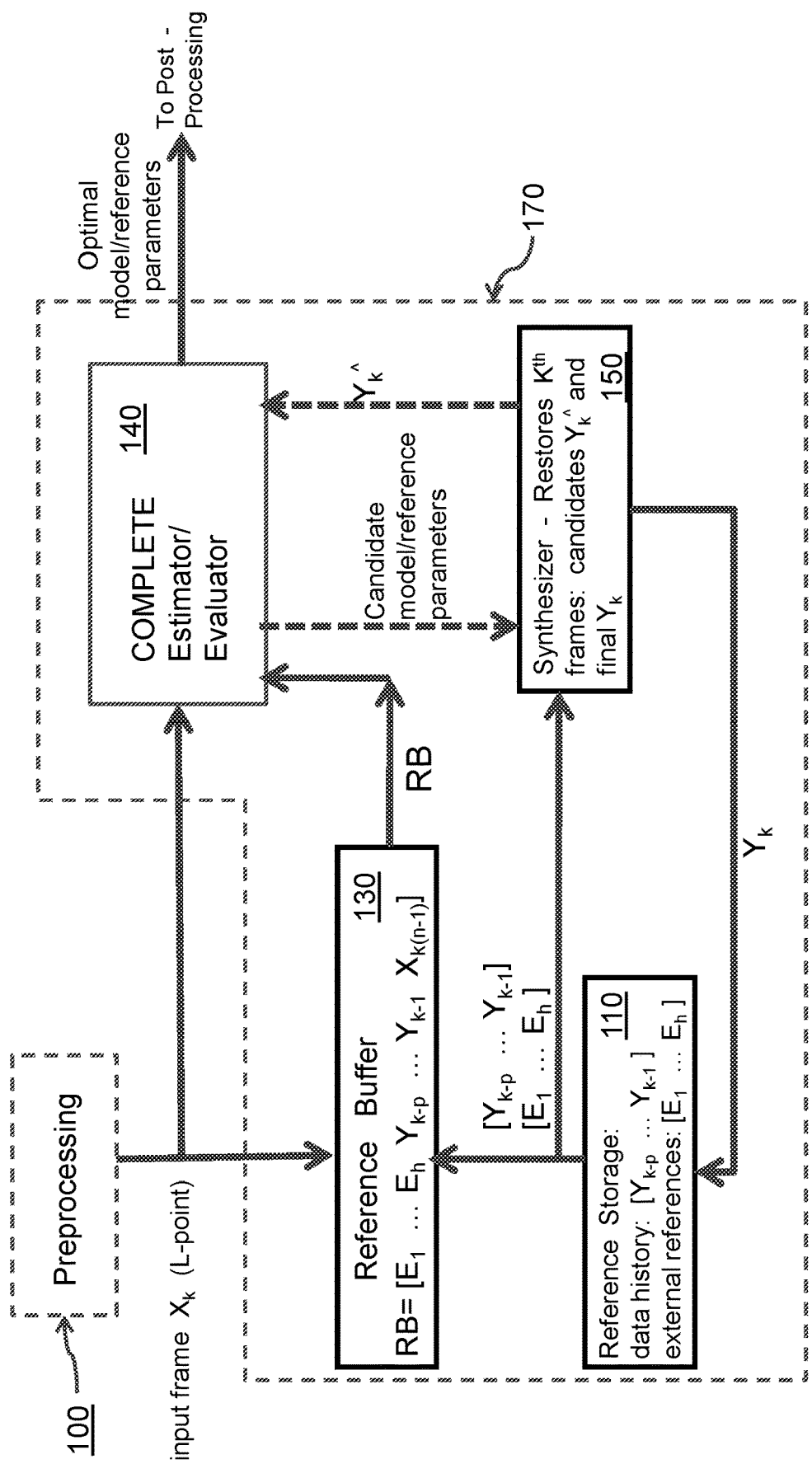
FIG. 2 illustrates an exemplary a block diagram of the essential analysis components for estimating parameters of the COMPLETE model ( ), which shows basic blocks of the code generating module 170 in greater detail.

FIG. 2 illustrates an exemplary block diagram of the essential analysis components for estimating parameters of the COMPLETE model (Eq. (1)), which shows basic blocks of the code generating module 170 in greater detail. As shown in FIG. 2, COMPLETE generator module 170 can include storage unit 110, reference buffer (RB) 130, model estimator/evaluator 140, and a signal synthesizer (decoder) 150. Unit 140 models the input frame $X_k$ as a function of reference vectors as described in detail in this mode. The reference vectors are supplied to unit 140 from reference buffer RB 130, which itself receives and organize inputs from storage unit 110 and preprocessor 120. Storage unit 110 can store some form of history of the received signal and, in some embodiments, external reference vectors defined below.

1. Reference Storage and Buffer, Units 110 and 130

Storage unit 110 in FIG. 2 stores reference information that can be used to model the current frame. One type of information unit 110 can store is the data history derived from the input received prior to the current frame $X_k$. Such historical values can provide part of the reference data for the COMPLETE. In the preferred embodiment shown in FIG. 2, the storage unit 110 accumulates restored earlier input frames $[Y_{k-p}, \ldots, Y_{k-1}]$, where $Y_{k-s}$, with s= (1, ..., p), denotes restored values of the input frame $X_{k-s}$, and as before, the subscript 'k-s' indicates the order in which the frame was acquired. Each $Y_{k-s}$ stored in 110 has been synthesized from the derived COMPLETE parameters for the corresponding frame 'k-s' by the decoder 150, using methods described more fully below. In other embodiments, storage unit 110 can store some form of the actual earlier inputs, optionally transformed as described above in preprocessor 120. If overlapping frames are used, the appropriately weighted actual/restored overlapping frames can be combined in 110 to reproduce the actual/restored input sequence within the overlap.

Another kind of references that can be stored in unit 110 are called 'external references' or 'external excitations', to distinguish them from the 'internal' excitations derived from the previously acquired frames. In some embodiments, external references $[E_1, \ldots, E_h]$ can be a set of predefined waveforms, a basic example would be a set of unit-amplitude sinusoids of various frequencies, and these waveforms or the parameters from which they can be synthesized, can be placed in unit 110 prior to the start of the system operation. The choice and the number of such waveforms would be typically dictated by the applications at hand and the hardware constraints. In other embodiments, external references can be inferred in several of the units of system 10 during its operation. Their basic function is to infer the information in the input data which may not be well modeled using data history and make this information available to the model in the form of additional references. The inferred excitations are encoded by system 10 as a set of parameters that can be used by a decoder to reconstruct the inferred excitation waveforms. For example, preprocessor 120 can estimate parameters that measure noise-like energy in the current frame $X_k$ and use those parameters to generate an external excitation. Such estimation can be done using known in the art methods. For instance, some speech coders use Fourier Transform based methods to estimate parameters of noise-like energy in the input. As another example, 140 or 150 can compute the residual, $R_k = X_k - Y_k$, between the input $X_k$ and its reconstructed version $Y_k$, and generate an external excitation based on the residual. When external excitations are inferred in 140 or 150 using an output of an estimated model, some embodiments may use the inferred external excitation, in addition to the existing reference vectors, to estimate a new model for the current data frame. Further, some embodiment options can employ both types of external excitations, the a priori defined and the inferred external references.

When at least some of the frame content must be reconstructed using external references, it may be because the frame contains random events, such as a pulse or noise-like energy. Alternatively, it may be because the available signal history does not contain sufficient for COMPLEX source pattern information, for example during the initialization of the COMPLETE system operation. Yet, another reason can be a change in the source structure itself, in which case the historical data may not have all the new source features. In the latter two cases, the content modeled by the external references is a part of the source structure and in the preferred embodiment it is incorporated into the data history. In this case, unit 110 can store the $Y_k$ frame that was reconstructed from all the used references, internal and external. Other embodiments are possible, where unit 110 can store a version of the input reconstructed only from the internal references included in its model, which would correspond to a source model based purely on the past source patterns. Yet, in other embodiments, unit 110 can store a version of the input reconstructed from the internal references included in its model and only some of the included external references. For example, only the a priori defined external references may be used and not the inferred ones. The choice among these options depends on the specific application and many implementations of the above embodiments can be designed based on basic principles.

Typically, storage unit 110 has a fixed length storage capacity. One cycle of the source pattern is required to model the entire source pattern with COMPLETE, but using more cycles provides robustness when operating in non-ideal environments. Thus, the chosen storage capacity of unit 110 would depend on the specific application, but it can also be constrained by other considerations, such as the hardware limits. The size of the storage unit 110 can be maintained at a specified capacity by deleting the oldest internal reference frames each time the new frame $Y_k$ placed in unit 110. A similar strategy may be used to update external reference vectors in some embodiments.

Unit 130 combines and arranges the reference information from unit 110 and all except the most recent point of the current frame $X_k$, i.e. L-1 points $X_{k(n-1)} = [x(n-L+1), \ldots, x(n-1)]$, which in FIG. 2 are received from preprocessor 100. The information is arranged in the reference buffer labeled as RB in FIG. 2 and it is accessed by units 140 and 150. In the embodiment shown in FIG. 2, the vectors in RB are arranged sequentially, starting with the external reference waveforms $[E_1, \ldots, E_h]$, which can be supplied by unit 110 or can be synthesized from their corresponding parameters in 110, if appropriate, prior to being supplied to unit 130; followed by the $[Y_{k-p}, \ldots, Y_{k-1}]$ sequence derived from data history as was described above; and then followed by the most recent L-1 data points $X_{k(n-1)}$ at the end. An infinite number of other buffer configurations can be used for RB, as long as the different parts of RB are indexed consistently by the various units of system 10. The inclusion of the $[x(n-L+1), \ldots, x(n-1)]$ points in RB make the shortest-scale structures available for modeling the input frame. This is a one aspect that differentiates the COMPLETE from the existing oscillators. The inclusion of external references $[E_1, \ldots, E_h]$ allows one to model parts of data that are not contained in the history. The combination of the improved data-driven oscillator with the use of external references is another novel aspect which enables modeling the entire data, structured and unstructured, with one parsimonious set of code.

In some embodiments, storage unit 110 does not contain frames of historical data when the system starts its operation and such data can also be cleared in some embodiments anytime the source pattern changes significantly. In such cases, the COMPLETE system 10 can start to generated data history in storage unit 110 using a priori provided external references and/or L-1 data points $[x(n-L+1), \ldots, x(n-1)]$ from the current input $X_k$, using all except the most recent point. A full L-point reference block can be produced in this case from the current input by augmenting the L−1 input points with an additional point which can be created in unit 130 by either repeating one of the existing points, for example by creating [x(n−L+1), x(n−L+1), ..., x(n−1)], or by extrapolating an additional point from several existing points using known extrapolation methods. Alternative embodiments can instead model the L−1 points [x(n−L+2), ..., x(n)] of the input using as reference the L−1 points [x(n−L+1), ..., x(n−1)] and the correspondingly sized vectors of the external references. A full L-point reference block then can be created from the L−1 point output of such a model by either repeating some data point in the restored frame or by extrapolating a data point from some of the points in the restored frame. Once such L-point reference block is created, it can be stored in unit 110 and used as reference for modeling subsequent frames. From that point, the system can generate data history using its regular embodiments described below. Another option for generating data history is to use a known in the art method (KAM) to create at least some or all the needed data history references in unit 110. Systems implementing such means will be described more fully in Mode 2.

It should be appreciated that storage unit 110, preprocessor 120, and buffer 130 do not need to be implemented as physically separate components, but can be implemented in a single software or hardware component, or split arbitrarily across multiple components, as long all the information can be accessed though appropriate software or hardware to emulate the operations described above.

It should be appreciated that the data sequences in units 110, 120, and 130 can refer to all types of transformed, filtered, windowed, or approximated versions of input data. Moreover, the sequences in storage unit 110, preprocessor 120, and buffer 130 can refer to some component, such as a wavelet component, of some raw/transformed/approximate version of the input signal.

2. COMPLETE Estimator/Evaluator 140

Estimator/evaluator unit 140 performs the COMPLETE model estimating function. The following description will refer to the embodiment shown in FIG. 2, where the references are arranged in a sequence in the buffer RB. The process of model estimation identifies a set of N L-length blocks $\{B_{d(i)}, i=1, \ldots, N\}$ in RB of 130 such that the input frame $X_k$ is modeled as some specified function of $\{B_{d(i)}\}$:

$$X_k = G(B_{d(i)}), i=1, \ldots, N, \qquad (1)$$

where:
G denotes the specified function form, linear or nonlinear;
N is the number of $B_{d(i)}$ blocks used in Eq. (1);
i is the index specifying the $i^{th}$ data block $B_{d(i)}$;
$B_{d(i)}$ is the $i^{th}$ block, referred to as the $i^{th}$ 'tap', that is drawn from the RB in 130 beginning with the entry d(i) of RB; where
d(i) denotes the $i^{th}$ delay (may also be written as $d_i$ for convenience) and is the pointer to the entry in RB 130 that is the first element in the block $B_{d(i)}$. The range of possible delay values is the integer set $1 \le d_i \le max_d$, $max_d$=m−L+1, where m is the total number of points in RB.

The COMPLETE model defined by Eq. (1) accounts simultaneously for the short- and long-scale patterns as well as unstructured components in the input. The set of delays $\{d_i\}$ provides a means of identifying the appropriate blocks $\{B_{d(i)}\}$ in RB 130. Model estimation amounts to estimating the values of delays $\{d_i\}$ and any variables that are specific to the function G. The function form represented by G is typically tailored to the particular application at hand, and can be nonlinear. In many applications, however, linear COMPLETE containing a few taps is sufficient to model with high accuracy many types of signals. For this reason, to facilitate the description of the more pertinent features of the present embodiment of the invention, the subsequent description of the current mode will place emphasis on linear COMPLETE, with nonlinear COMPLETE being envisioned in some embodiments of the present invention.

Linear COMPLETE expresses $X_k$ as a linear combination of blocks $\{B_{d(i)}\}$:

$$X_k = \sum_{i=1}^{N} a_i B_{d(i)}, \qquad (2)$$

where:
N, $d_i$, $B_{d(i)}$ are as defined above in Eq. (1); and,
$a_i$ is the relative scaling (weight) of the corresponding block $B_{d(i)}$.

The parameters needed to be estimated in Eq. (2) include the sets $\{a_i\}$ and $\{d_i\}$, for i=1, ..., N, and the number of terms N. Note that, because of the efficiency of COMPLETE, many signal classes can be accurately encoded with N=2 linear COMPLETE model. Even for highly complex signals, N=4 can be sufficient. Further, the choice of N is often known for a given application. In such case, estimating model in Eq. (2) reduces to estimating only the parameter set $\{a_i, d_i\}$. Several methods for estimating parameters $\{a_i, d_i\}$ are described below. If the number of model terms N must also be estimated, the same methods provided below can be used to estimate parameter sets $\{a_i, d_i\}$ for different values of N and known in the art methods, for example the Akaike information criterion, can be employed to select the optimal number of terms N. Adaptation of the described methods to nonlinear COMPLETE of Eq. (1) will be given at the end of section 2.

Estimation of COMPLETE Parameters

The parameters $\{a_i, d_i\}$ can be estimated in COMPLETE estimator/evaluator 140 by adapting one of several known methods for fitting parametric models to data. The embodiments described here generally perform two basic procedures. The first procedure generates a multitude of candidate models. The results are then passed to the second procedure, which evaluates performance of the estimated candidate models using preselected metrics, to find the 'best performing' model. The 'best performing' model is defined as the model that provides the best outcome as measured by preset criteria. Several embodiments for each procedure will be described below. It should be appreciated that these descriptions provide examples and are not exhaustive means for estimating COMPLETE and its parameters. Using other methods based on the basic principles should in no way diminish the claims made in this invention.

The First Procedure—Generating Multiple Candidate Models

The methods provided here for generating candidate models perform three basic steps: the first step picks one or more candidate delays $\{d_t^\sim\}$, where t=1, ..., T, T≤N and the superscript $\sim$ is used to indicate that this is a candidate value being considered, and retrieves the corresponding blocks $\{B_{dt}^\sim\}$ from RB 130. The second step computes the corresponding to $\{B_{dt}^\sim\}$ coefficients $\{a_t^\sim\}$. This can be done by solving by known means the algebraic least-squares problem:

$$[a_1^\sim, K, a_T^\sim]' = \text{inv}[B_{d(i)}^\sim] X_k', \qquad (3)$$

where:

[$\hat{B}_{d(t)}$] is a matrix whose columns are the blocks $\{\hat{B}_{d(t)}\}$ selected from 130;

inv[$\hat{B}_{d(t)}$] is a pseudo-inverse of the [$\hat{B}_{d(t)}$] matrix, computed using known methods, for example the singular value decomposition method;

[$\hat{a}_1, \ldots, \hat{a}_T$]' is a column vector composed of the coefficients $\{\hat{a}_t\}$; and, $X'_k$ is a column vector composed of the elements of the input $X_k$.

The above two steps are repeated to create a multitude of candidate parameter sets $\{\hat{a}_t, \hat{d}_t\}_j$, where the subscript $j=1, \ldots, J$ is used to index a particular candidate set, each such set derived for the specific choice of $\{\hat{d}_t\}$ selected in the first step. As an additional step, if appropriate for the given application, COMPLETE parameters may be quantized, by means described below. The third step computes, for each candidate set $\{\hat{a}_t, \hat{d}_t\}_j$, the COMPLETE model output as defined in detail later.

A number of implementation options exists for the steps 1 and 3 in particular. Several implementations of steps 1 (and the corresponding adjustments to step 2) are described next. Following that, options for measuring 'model output' used in step 3 will be described in the model evaluation section.

Methodologies for Generating Candidate Parameter Sets $\{\hat{d}_t\}_j$

Three methods for generating candidate parameter sets are described below, which can correspondingly use an exhaustive search, a sequential search, and a constrained search to generate candidate delay sets. All three methods draw delay values from the integer set D, which itself is constructed from the range [1 max$_d$]. Some values in the [1 max$_d$] set do not provide meaningful delays and do not need to be included as part of D. Specifically, all the points in the sequence composed of [$Y_{k-p}, \ldots, Y_{k-1}$] typically provide meaningful references so the delays that index $B_{d(i)}$ blocks of these points would typically be included in D. On the other hand, blocks $B_{d(i)}$ that span two external references, e.g. $E_i$ and $E_{i+1}$, or the external reference $E_h$ and $Y_{k-p}$, typically do not provide meaningful references so the delays which index those blocks would not be included in D.

An exhaustive search method selects combinations of N delays from D and then computes the corresponding coefficients $\{\hat{a}_1, \hat{a}_2, \ldots, \hat{a}_N\}$ for each combination by solving Eq. 3 above. The exhaustive search method can generate all feasible sets of delay and the corresponding coefficient values first and then evaluate the outcomes from all the resulting candidate models to identify the optimal parameter set that produces the best model outcome. Alternatively, feasible sets of parameters can be generated and evaluated in sets of groups. One of many existing intelligent search methods, such as evolutionary programming, may be used to implement exhaustive searches. The exhaustive search method can produce the closest to the optimal model among the three search methods but it can be computationally expensive when estimating COMPLETE models that contain more than two delays.

Another method is a sequential search approach, which uses an iterative process where each step finds a subset of best parameter values. For example, a sequential search which considers one delay at a time, is implemented as follows. First, the optimal delay value $d_1^*$ is found for the one-delay COMPLETE of Eq. (2), i.e. $X_k = a_1 B_{d1}$, by evaluating the candidate model outcomes for all possible values of $d_1$ chosen from the set D and their corresponding coefficients $a_1$ found by solving Eq. 3. In the next iteration, the optimal $d_2^*$ value is found by evaluating all the candidate two-delay COMPLETEs in which the $d_1^*$ value is kept fixed to the optimal value found in the first iteration, and the candidate $\hat{d}_2$ values are selected from D. The coefficients $\{\hat{a}_1, \hat{a}_2\}$ corresponding to a candidate set of delays $\{d_1^*, \hat{d}_2\}$ are calculated by solving Eq. 3 as before. Note that while the value of $d_1^*$ is fixed after the first iteration, the value of the coefficient $a_1$ is not and must be recalculated in each subsequent iteration. The process repeats until the optimal values for all the COMPLETE parameters are obtained. The sequential search method can produce near-optimal results at a significantly lower complexity than the exhaustive search.

The third method is a constrained search which can combine certain aspects of the preceding two methods. First, a sequential search is performed as described above to produce a "seed" estimate $\{\hat{d}_1, \hat{d}_2, \ldots, \hat{d}_N\}$. This estimate then serves as a baseline for selecting candidate delays by constraining them to the range around the seed: $\hat{d}_i - \mu \leq d_i \leq \hat{d}_i + \mu$, $i=1, \ldots, N$, where $\mu$ specifies the number of points around each $\hat{d}_i$ and its value is set depending on the desired search complexity. The exhaustive search procedure described above is used within this constrained candidate delay range to generate new sets of candidate parameters and evaluate the corresponding model outcomes to identify the parameter values that produce the best model outcome. The performance of this method is typically between that of the first two methods.

The above descriptions of parameter generation methods treat equally all types of references that are included in RB 130. Alternative embodiments can be used where a subset of reference waveforms in RB can be chosen preferentially over others in modeling $X_k$. For example, in some embodiments the latest data history can be preferred over the earlier acquired history. In another example, 'internal' references [$Y_{k-p}, \ldots, Y_{k-1}$] may be preferred over the external references [$E_1, \ldots, E_h$]. Preferential treatment of particular references can be implemented as part of the model evaluation and selection process, which is described below. The parameter generation methods described above can also be modified for this purpose and these modifications can be typically implemented in addition to any preferential treatment that may be employed during model evaluation and selection. For example, the above methods can be modified where candidate sets $\{\hat{a}_t, \hat{d}_t\}_j$ are sorted to reflect the desired preference. For example, when models which depend on the most recent data history are preferable, candidate parameter sets can be sorted in the order of decreasing values of the smallest delay in each set, so that models referencing the most recent data history (indexed by largest delays) can be evaluated first during the candidate model evaluation/selection process. The candidate model evaluation/selection process can then terminate when the first model that meets the desired performance criteria is found. Another strategy, which can be used by itself or in conjunction with the previous strategy, is to generate only a subset of candidate parameter sets that correspond to the most preferable references and evaluate this subset first. As with the first strategy, the candidate model evaluation/selection process can terminate if a model that meets the desired performance criteria is found from the first subset. Otherwise, candidate sets involving less preferable references can be created and evaluated next. More advanced embodiments can include complex trade-off criteria that can allow users to favor specific references in the models even when the choice leads to subpar results. For example, in some embodiments, a predetermined loss in performance can be allowed for models which depend only on 'internal' references $[Y_{k-p}, \ldots, Y_{k-1}]$, if such models are preferred. In general, many implementations that favor some references in RB 130 over others can be designed using basic principles and employment of such designs should in no way diminish the claims made in this invention.

The Second Procedure—Evaluating Candidate Models

The first procedure, described above, outputs a set of parameterized candidate models derived according to Eq. (2). Adaptations of various methods that can be used by estimator/evaluator 140 for the purpose of evaluating quality of these candidate models are described next. Typically, when a model is defined by an equation, its output is computed using this equation. Specifically, in the case of Eq. (2), the standard model output is defined as $X_k\hat{}(j)=\Sigma_1^T a_t B_{dt}\hat{}$, given here for the instance of the jth candidate parameter set $\{a_t\hat{}, d_t\hat{}\}_j$ with $t=1, \ldots, T, T \leq N$, and the rest of the notation is the same as defined above. Typically, such standard output $X_k\hat{}(j)$ would be used to evaluate model quality. A common measure in this regard is the mean squared error (MSE), given for the instance of $j^{th}$ candidate parameter set $\{a_t\hat{}, d_t\hat{}\}_j$ as:

$$MSE(j) = \frac{1}{L}[X_k - X_k^\wedge(j)]'[X_k - X_k^\wedge(j)]. \qquad (4)$$

The best candidate model is identified in this case as the model which minimizes the MSE. In general, a large number of metrics can be substituted in place of the MSE to analyze statistical, temporal and frequency domain properties of a model output. The choice of a metric or metrics can be determined by the needs of the specific application. The invention, without limitation, covers use of any metric, either existing in the art or designed based on basic known principles, individually or in conjunction with other known metrics, for the purpose of evaluating the quality of the candidate COMPLETE models. Several such metrics will be described later in this section.

In addition to utilizing a range of metric options for evaluating the quality of candidate models, several embodiments are described next which use model outputs other than the standard $X_k\hat{}$ defined above. In some embodiments, including the embodiment shown in FIG. 2, a second model output, which is $Y_k\hat{}$ synthesized in synthesizer 150 from the parameters supplied by unit 140, is used as part of model evaluation/selection process and it is also used in creating data history references in unit 110. The key observation here is that the synthesized $Y_k\hat{}$ may not be equal to the estimated $X_k\hat{}$ for a given parameter set in the case of COMPLETE, because $Y_k\hat{}$ may be derived from the reconstructed data in the input frame, while $X_k\hat{}$ references the actual data in $X_k$. Further, both estimates, $X_k\hat{}$ and $Y_k\hat{}$, can be computed using approximate rather than exact model parameters, for example quantized parameters, where quantization is done by means described below. Thus, in the provided embodiments, the existing metrics used to evaluate closed form models, such as the MSE in Eq. (4), can be modified where all instances of the model estimate $X_k\hat{}$ are replaced with an estimate $X_k\hat{\hat{}}$ computed using Eq. (2) with approximate, e.g. quantized, parameters, or alternatively replaced with an estimate $Y_k\hat{}$ synthesized either from the exact or approximate model parameters. In practice, it is more meaningful to use certain metrics with the synthesized $Y_k\hat{}$ and other metrics with $X_k\hat{}$, and the choice would be determined by the application at hand. For example, in applications involving speech, it is often desirable to optimize the perceptual characteristics of the synthesized output $Y_k\hat{}$ rather than those of $X_k\hat{}$. It should be noted that model evaluations based on $Y_k\hat{}$ can be viewed as related to analysis-by-synthesis technique in which system outputs synthesized from various inputs are compared to select the best output. However, a metric based on synthesized output used in the COMPLETE model selection process in many embodiments can be coupled with other metrics, typically involving $X_k\hat{}$ or $X_k\hat{\hat{}}$, so the entire COMPLETE model estimation procedure can comprise a multi-step evaluation process. In a non-limiting example, an embodiment that uses two metrics sequentially may first generate q best candidate models according to the minimum MSE criterion given by Eq. (4), then synthesize in synthesizer (decoder) 150 the q outputs $Y_k\hat{}$ from the quantized parameters of these q best candidate models and pass the q synthesized outputs to estimator/evaluator unit 140 where they are then evaluated using a second metric, for instance the PWE perceptual metric given in Eq. (7) below. Mode 3 of the present embodiment of the invention provides a specific case of a speech coder that utilizes multiple evaluation metrics. The design of evaluation procedures based on multiple metrics is a part of the COMPLETE that not only adapts it to practical applications but is used to ensure stability of the COMPLETE model for the expanded range of references that it employs. Non-limiting examples of some metrics are given next, written for the instance of evaluating $Y_k\hat{}$, but, as stated above, these and other metrics can alternatively be utilized with $X_k\hat{}$ or $X_k\hat{\hat{}}$ to evaluate COMPLETE quality, if justified by a given application.

SIGNAL-TO-NOISE RATIO: Minimum signal-to-noise ratio (SNR) is a common criterion used for selecting the optimal model. For $Y_k\hat{}$, SNR can be computed as $$SNR(j) = 10\log_{10}\frac{X_k^2}{[X_k - Y_k^\wedge(j)]^2}, \qquad (5)$$

where j indicates the index of the candidate parameter set $\{a_t\hat{}, d_t\hat{}\}_j$.

LOG-SPECTRAL DISTANCE: Log-spectral distance (LSD) can be another common metric for evaluating spectral properties of the model outcome. It can be computed as $$LSD(j) = \sqrt{\frac{1}{f_s}\int_0^{f_s} 10\log_{10}\frac{|F[X_k](f)|^2}{|F[Y_k^\wedge](j,f)|^2}df}, \qquad (6)$$

where
$f_s$ is the sampling frequency;
F indicates a Fourier Transform;
f is the frequency bin of interest in [0 fs]; and,
j is the index of the candidate parameter set $\{a_i\hat{}, d_i\hat{}\}_j$.

A common metric for evaluating perceptual quality of speech is the perceptually-weighted error (PWE). Perceptual quality is optimized by minimizing PWE:

$$PWE(j) = \frac{1}{f_s}\int_0^{f_s}|F[X_k](f) - F[Y_k^\wedge](j,f)|^2|W(f)|^2df, \qquad (7)$$

where
$f_s$, F[·], and j are defined above in Eq. (6);
|·| indicates the magnitude spectrum;

W(z) is a weighting filter given by $$W(z) = \frac{Z[b](z/\gamma_1)}{Z[b](z/\gamma_2)},$$

where Z indicates the Z-transform and coefficients b are computed by minimizing a misfit error of a linear prediction model:

$$X_k = \sum_{u=1}^{U} b_u X_k(u), \quad (8)$$

where $X_k(u) = [x(n-u-L+1), \ldots, x(n-u-1)]$ denotes the length-L data sequence that has latency u−1 with respect to the last point of the current frame.

The methods described here should not be interpreted as providing comprehensive or exhaustive means for performing said model evaluations. Using other evaluation methods based on the basic principles should in no way diminish the claims made in this invention.

The model parameters may be quantized in the process of their estimation in 140 or 150, or later during their post-processing in 160. Quantization can be implemented using any number of methods from the existing art, including but not limited to vector quantization for the coefficients $\{a_i\}$, scalar quantization for the delays $\{d_i\}$, and all derivatives thereof.

The outcome of the evaluations performed in estimator/evaluator 140 is the parameter set $\{a_i\hat{}, d_i\hat{}\}*$ that produces the best model outcome. If the optimal model utilizes inferred external references, the parameters needed to reconstruct these references also become part of the output code from unit 140. Thus, the COMPLETE code for the input frame can include model parameters and, if applicable, parameters for the external references. The final code can be outputted from estimator/evaluator 140 to synthesizer 150 and also to the post-processor 160 for storage and/or transmission. According to the embodiment shown in FIG. 2, if the desired form of the optimal restored frame $Y_k$ was not saved during model estimation process, it is synthesized in unit 150 from the supplied parameters and outputted to storage unit 110. Unit 160 can further process or transform the COMPLETE code prior to storing/transmitting it by means appropriate for the application at hand. For example, if the parameters have not been quantized in 140, they may be quantized in post-processor 160 using methods in existing art as stated above.

The analysis steps described above can be transferred in a straightforward way to any nonlinear model that consist of a weighted sum of linear and nonlinear functions of $\{B_{d(i)}\}$. Further, a general nonlinear function can be approximated by a truncated polynomial expansion comprising a weighted sum of $\{B_{d(i)}\}$ blocks themselves as well the elements of some of the blocks raised to some power. The analysis methods described above can be adapted to estimate such polynomial expansions of nonlinear models, as follows. The delays $\{d_t\hat{}\}$ can index data blocks in the reference buffer 130 as before. Blocks of data $\{B_{dt}\}$ can be retrieved for the selected delay values as above and can be used to compute sets of new blocks $\{B\hat{}_{term(c)}\}$, where each $B\hat{}_{term(c)}$ corresponds to the $c^{th}$ term of the polynomial expansion. After the blocks $\{B\hat{}_{term(c)}\}$ are computed, their corresponding weights in the polynomial expansion are computed analogously to the coefficients $\{a_i\hat{}\}$ in the linear COMPLETE case, by substituting in Eq. 3 the terms $\{B\hat{}_{term(c)}\}$ for the $\{B_{dt}\}$. The rest of the analysis can proceed as described for linear COMPLETE above.

3. Decoding of a Signal in Synthesizer 150 and Decoder 250

Figure 3:
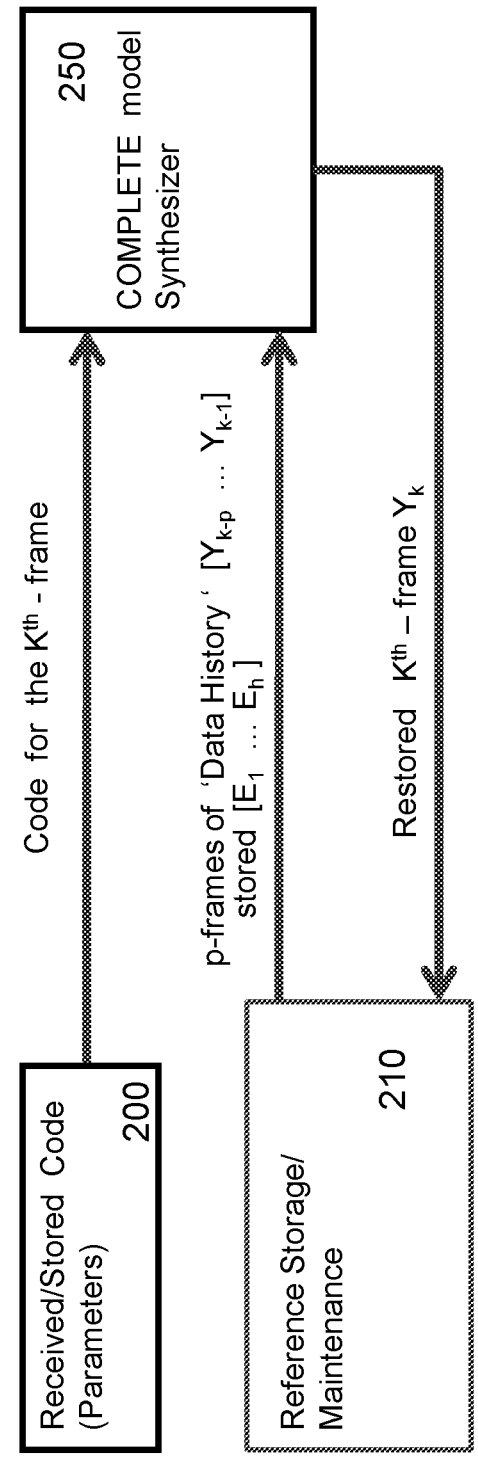
FIG. 3 illustrates an exemplary a block diagram of the COMPLETE synthesizer/decoder that restores the signal from the received COMPLETE parameters, in accordance with an embodiment of the present invention.

FIG. 3 illustrates an exemplary block diagram of the COMPLETE synthesizer/decoder that restores the signal from the received COMPLETE parameters, in accordance with an embodiment of the present invention. Decoding refers to the operation performed in synthesizer 150 in FIG. 2 and also in unit 250 in FIG. 3. The synthesizer (decoder) 150/250 restores to some precision the original input frame from the supplied parameters. In the case of synthesizer 150 of FIG. 2, the synthesis parameters are inputted from estimator/evaluator 140, and in the case of the standalone decoding system in FIG. 3, the parameters are obtained from the transmitted/stored code.

In the decoder embodiment described in FIG. 3, the signal is restored in unit 250 in the same way it is synthesized in 150. In the embodiment shown in FIG. 3, unit 210 stores and arranges the restored 'signal history' $[Y_{k-p}, \ldots, Y_{k-1}]$ and also any a priori defined external references, either their actual waveforms or the parameters needed for their generation. The arrangement in 210 mirrors the arrangement of these references in unit 130 in FIG. 2. The parameters needed to generate inferred external references, if any, are also supplied as part of the transmitted/stored code to the decoder in FIG. 3 and are used to generate these external reference waveforms. In the event none of the delays $\{d_i\}$ in the code supplied to units 150/250 index any of the points in the current data frame, the current frame $Y_k$ is restored from the supplied parameter set analogous to the computation of the model estimate given by the Eq. (2) above for frames $X_k$, that is:

$$Y_k = \sum_{i=1}^{N} a_i B_{d(i)}.$$

Otherwise, if at least one delay indexes data in the current input frame, synthesizers 150/250 synthesize the entries of $Y_k$ point-by-point, beginning with the earliest point of the current frame and advancing toward the end of the frame, estimating each point as:

$$y(s) = \sum_{i=1}^{N} a_i b(d(i) + s - 1),$$

where b(d(i)+s−1) refers either to a point in the existing reference, if (d(i)+s−1)≤$max_d$, or, otherwise, to the element of the current frame that has been synthesized prior to the current y(s) and is being held in the respective buffers accessed by 150/250.

Mode 2: Combining COMPLETE with Known in the Art Methods

Figure 4:
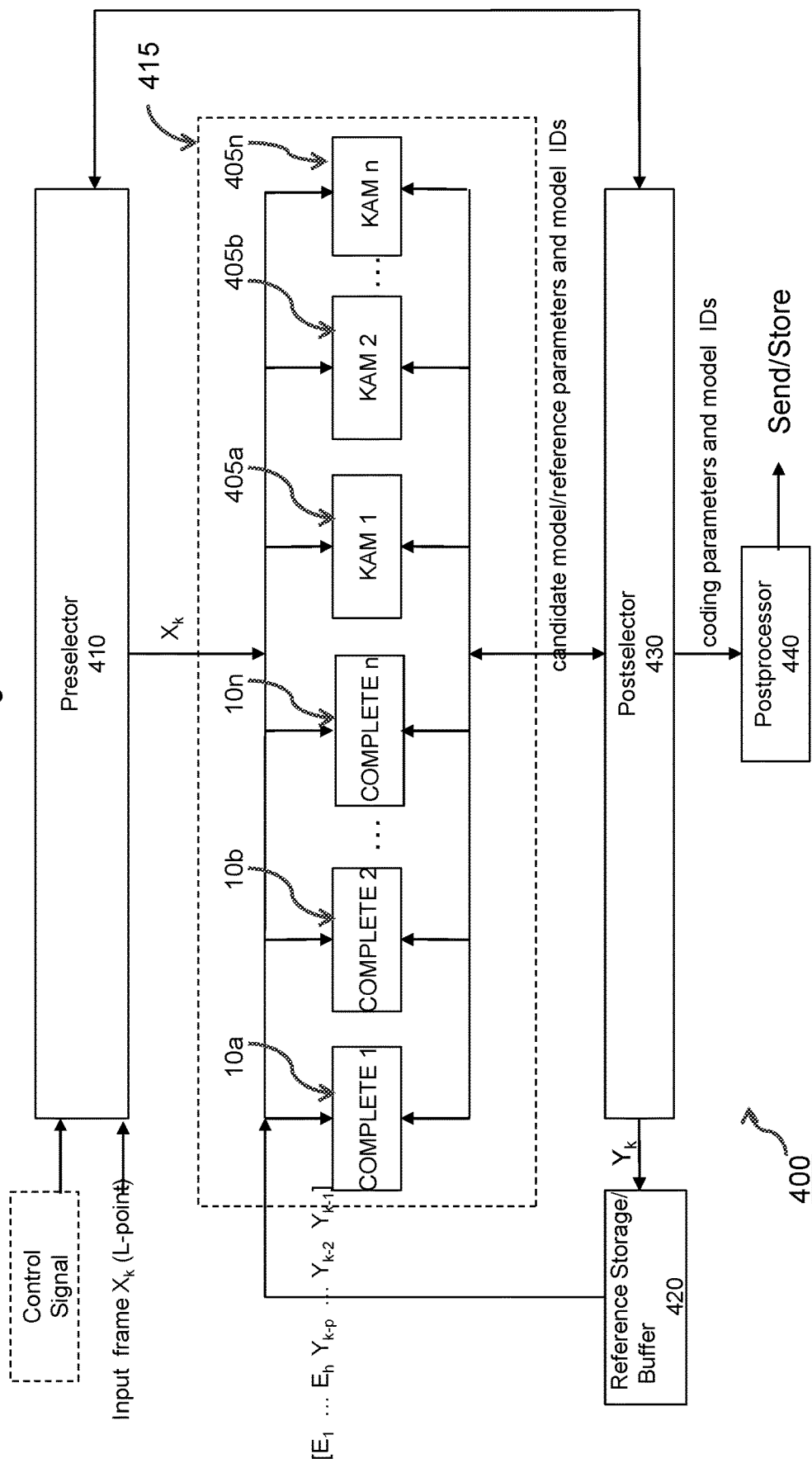
FIG. 4 illustrates an exemplary a block diagram that illustrates components of a general multimodal COMPLETE/KAM system, in accordance with an embodiment of the present invention.

FIG. 4 illustrates an exemplary block diagram that illustrates components of a general multimodal COMPLETE/KAM system, in accordance with an embodiment of the present invention. FIG. 4, shows the general structure of a hybrid, multi-mode COMPLETE/KAM system 400, which encodes an input frame by choosing among various forms of the COMPLETE units $10_a, 10_b, \ldots, 10_n$, and various known in the art methods (KAMs) $405_a$, $405_b$, ..., $405_n$, and combinations thereof, the various blocks and units of which may be implemented in hardware, software, or a combination thereof. The embodiments of system 400 can provide two practical functions: 1) Initialization of the COMPLETE; and 2) Improving performance of a KAM or alternatively, performance of the COMPLETE in applications where the COMPLETE by itself does not provide the desired level of performance. As discussed in the Summary of the Invention, 'pattern-breaking' events in the input signal, such as significant rises in unstructured energy, discontinuities, and transients that occur on a short time-scale relative to the scale on which on-going patterns in the signal evolve, can negatively impact COMPLETE performance. In such cases, KAM 405 can be used to encode some parts of the signal and COMPLETE can be used to encode other parts, to enhance the overall performance over what can be provided by the KAM or the COMPLETE alone.

The COMPLETE/KAM system 400 in FIG. 4 can include a preselector 410, which can analyze the input signal $X_k$ and choose which COMPLETE 10, KAM 405, or combination of COMPLETE 10/KAM 405 to be used to model $X_k$; a COMPLETE/KAM encoding module 415, which can contain a bank of various COMPLETEs 10 and KAMs 405 model estimation units, which can be activated by the preselector 410 and/or the postselector 430; a reference/storage unit 420, which can contain restored earlier input frames $[Y_{k-p}, ..., Y_{k-1}]$ that can be accessed by the COMPLETEs 10 and, if required, by KAMs 405 unit(s) of COMPLETE/KAM Module 415; a postselector 430, which routes the relevant output from the ultimately selected 'best' model to storage 420 and postprocessor 440 and, optionally, it can evaluate the outputs of the candidate models supplied from COMPLETE/KAM Module 415; and postprocessor 440.

For Mode 2, the data preprocessing functions in preselector 410 that produces input frames for the multimodal COMPLETE/KAM system, can be analogous to the preprocessing functions in the preprocessor 120 of FIG. 1 described in Mode 1, so the description of this component and associated preprocessing steps is not repeated for Mode 2. Similarly, the functions in postprocessor unit 440 in FIG. 4 can be implemented analogously to the functions in postprocessor 160 in Mode 1 (See. FIG. 1), with the exception that postprocessor 440 can perform an additional function, which is to package the parameters of the final model together with their model identifier code. The model identifier code is supplied to 440 by postselector 430, along with the model parameters, and consists of the minimum number of bits necessary for a given system to specify which model or combination of models has been used for encoding the current frame.

Preselector 410 and postselector 430, and COMPLETE/KAM Module 415 in FIG. 4, provide the main blocks for various embodiments of the COMPLETE/KAM system. Embodiments of three basic implementations of the COMPLETE/KAM system will be described below following the description of operations performed by units 410 and 430, and COMPLETE/KAM Module 415.

As part of its operation, preselector 410 can select a set of COMPLETEs 10 and/or KAMs 405 in COMPLETE/KAM Module 415. In some embodiments, the implementation of preselector 410 can be a simple de-multiplexer that selects between just two models, a single COMPLETE 10 and a single implemented KAM 405, and may, optionally, also select a combination of the two. Alternatively, preselector 410 can perform sophisticated processes of selecting methods in COMPLETE/KAM Module 415 based on the nature of the input signal $X_k$. Such selection processes can involve computing parameters for the input $X_k$ that reflect statistical and/or deterministic properties of the signal, analyzing these properties and then using the results to select the combinations of multiple COMPLETEs $10_a$-$10_n$ and KAMs $405_a$-$405_n$ to model $X_k$. Depending on what is appropriate for a given application, the computed parameters for the input $X_k$ can reflect any number of statistical, temporal, frequency, and time-frequency properties of the signal, which can be obtained using prior art methods. The computed parameter values can be analyzed relative to preset baselines/thresholds or other predetermined metrics.

One function that preselector 410 can be used for is for detecting 'pattern-breaking' events. For these embodiments, preselector 410 can analyze consistency of certain parameters across the current and the preceding frames $X_k$ using known methods. For example, preselector 410 can compare the distribution of the deterministic energy in $X_k$ relative to that in some preceding input frames $[X_{k-p} ... X_{k-1}]$. The distribution can be measured, for example, by computing fundamental frequency (called pitch period in speech coding) and other parameters which can reveal the proportion of quasi-periodic energy (V) and noise-like energy (U) in the frames. These parameters can be estimated using known in the art methods. For example, some speech coders compute U and V parameters using Fourier Transform (FT) based methods, such as Fast Fourier Transforms (FFTs), to make voiced/unvoiced determination for each frame. The computed parameters V(t, w), for the quasi-periodic energy and U(t, w), for the noise-like energy, are functions of time(t) and frequency(w). Other known methods for computing these parameters can also be used. In this example, the computed distribution of the quasi-periodic and noise-like energy in time and frequency in the given frame relative to the distribution of these quantities in the preceding frames could control whether and how many COMPLETEs 10 and KAMs 405 can be selected by preselector 410. Such control process can be implemented in a number of known ways as well, taking into account the desired quality of the output. For example, the distribution of the quasi-periodic energy V and noise-like energy U can be partitioned into ranges or bins and a particular choice of a COMPLETE and/or KAM can be assigned to each bin.

Preselector 410 can also receive control commands from external resources, which can modify the settings in preselector 410 or, alternatively, the commands can be integrated as part of the decision logic in preselector 410. For example, knowledge of when 'pattern-breaking' events occur may be available outside the COMPLETE/KAM system, in which case the external command can supply this information to preselector 410, thus freeing preselector 410 from performing such analyses.

As stated above, COMPLETE/KAM Module 415 in FIG. 4 contains a bank of one or more COMPLETE 10 and KAM 405 estimators. Each COMPLETE 10 in COMPLETE/KAM Module 415 estimates a different functional form of the COMPLETE. For example, COMPLETE/KAM Module 415 can contain a bank of 4 COMPLETE units, where each individual unit estimates a linear COMPLETE with a specific number of delays, ranging from 1 to 4. Each COMPLETE 10 or KAM 405 can be assumed to stay inactive until it is switched "on" by an input either from preselector 410, postselector 430, or from another COMPLETE 10 or KAM 405 within COMPLETE/KAM Module 415. Thus, the COMPLETE and KAM units can be switched "on" and applied to the provided input individually or in various combinations, that is in-series, in-parallel, or a mix of in-series and in-parallel combinations. In a 'in-series' combination, the first selected unit encodes $X_k$, the next unit encodes the residual output of the first, and so forth, the end result being a serial model, for example (COMPLETE $10_a$+KAM $405_a$+ . . . KAM $405_e$). In an 'in-parallel' combination, the first selected unit encodes a part of $X_k$, the next unit encodes another part of $X_k$, and so forth. Further, these described approaches can be used in conjunction with each other to create any combination of COMLETEs and KAMs.

KAM 405 units can use known methods to estimate their respective models. For the COMPLETE 10 units in FIG. 4, the same implementations can be used as for COMPLETE estimator/evaluator 140 and synthesizer 150 of COMPLETE 10 described above (See FIG. 2), with the following exception. The evaluation of candidate model quality which was described for COMPLETE evaluator/estimator 140 above may be split in Mode 2 between the model estimation units of COMPLETE/KAM Module 415 and postselector 430. The way this part of the process may be split can depend on the choice of a particular COMPLETE/KAM system implementation, with some choices being described more fully below. Regardless of how the model evaluation function may be divided between COMPLETE/KAM Module 415 and postselector 430, however, the overall process and the metrics used for evaluating the candidate models to select the optimal model for the given method are analogous to those described for unit 140. Further, it should be noted that in several embodiments, candidate model outputs are synthesized within the respective COMPLETE or KAM estimation unit. An alternative embodiment can use other components within or outside COMPLETE/KAM Module 415 to synthesize these model outputs for some of the embodiments.

It should be appreciated that the separate COMPLETEs 10 and KAMs 405 in COMPLETE/KAM Module 415 shown in FIG. 4 are used to represent the different forms of the COMPLETE and the different KAMs strictly for the sake of clarity of the description. Estimation of several model types can be accomplished within a single unit or split in some way across several units, in which cases software or hardware would be used to select the specific terms appropriate for the desired model. For example, instead of using four separate units to estimate the four linear COMPLETEs, each having a different number of delays ranging from 1 to 4, COMPLETE/KAM Module 415 may have a single COMPLETE unit allowing up to four delays and the desired number of delays would be chosen during the model estimation process.

Once model estimation process in COMPLETE/KAM Module 415 is completed, the modeling results can be supplied to postselector 430 for further processing. As shown in FIG. 4, postselector 430 can receive results from the COMPLETE/KAM Module 415 and may assess the supplied results. The choice of a particular logical structure of the COMPLETE/KAM system 400 (some available logical structures are described below) controls how much processing is performed in postselector 430. The following describes the complete set of functions that postselector 430 can perform with the understanding that the specific implementations can incorporate all, a part, or even none of the described processing steps.

One function that can be performed in postselector 430 is an evaluation of analysis outcomes received from COMPLETE/KAM Module 415. Two types of evaluations can be performed. The first type evaluates model quality and can be used to help select among the various candidate models obtained from a single modeling method. The second type of evaluation can be used to choose among the results obtained from different COMPLETEs 10 and/or KAMs 405 in COMPLETE/KAM Module 415. The first type of evaluation can be implemented in postselector 430 using methods for evaluating model quality which were described for COMPLETE estimator/evaluator 140 in Mode 1. The second type can be implemented using the same methods for evaluating model quality as in the COMPLETE estimator/evaluator 140 in Mode 1, but it can also include performance measures other than those related to the model quality. Examples include coding efficiency in terms of the number of bits required to encode the given parameter set, computational complexity, model robustness with respect to environmental noise, quantization robustness, and other performance metrics that are known in the art and suitable for the specific applications at hand. All these known measures can be computed using prior art methods. Further, multiple performance metrics can be used in conjunction with each other and with measures related to model quality, in which case the evaluation would typically involve a performance trade-off based on multiple metrics. One example is a selection criterion that involves a trade-off between the model quality and coding efficiency.

The evaluation outcome can control the decision process made in postselector 430. One implementation option is for postselector 430 to always select the best model according to some preset criteria and this model is taken as the final outcome of the analysis, in which case postselector 430 outputs the selected model parameters together with the model identifier code to postprocessor 440, and, if available, outputs to storage 420 the final $Y_k$ frame restored from the parameters of the selected optimal model. If the final $Y_k$ is not available, postselector 430 instructs COMPLETE/KAM Module 415 to synthesize this $Y_k$ and to output it to unit 420. Alternatively, in some implementation options postselector 430 can choose to continue the model estimation process in COMPLETE/KAM Module 415. To initiate a new iteration of the model estimation process, postselector 430 turns on the selected model estimation units in COMPLETE/KAM Module 415 and supplies any necessary input the them. The data frames supplied to units in 415 through postselector 430 may contain some form of data derived from $X_k$ or, alternatively, this input may be obtained from a previous iteration, for instance f the residual error obtained from a previous iteration. These model estimation steps may be repeated iteratively until postselector 430 chooses the final model and terminates the model estimation process by outputting the selected model parameters together with the model identifier code to unit 440, and also outputting to unit 420 the $Y_k$ frame restored by the selected model, as described immediately above.

There are three basic logical structures for the COMPLETE/KAM system 400, which can combine in different logical sequences the various functions performed in preselector 410, COMPLETE/KAM module 415 and postprocessor 430. These embodiments can be referred to as Decision-First (DF), Decision-Later (DL), and Mixed-Decision (MD) embodiments. A specific example of an MD embodiment for a speech coder will be provided in Mode 3.

Decision-First (DF): The DF embodiment makes all the decisions regarding the choice of a model in the preselector 410 in FIG. 4, and selects one specific method, which can be a COMPLETE, a KAM, or a combination of a COMPLETE and/or KAMs, for encoding a given frame $X_k$. A basic example of DF embodiment is a system for COMPLETE initialization, in which the basic COMPLETE/KAM system consists of one COMPLETE and one KAM. In this case, unit 410 is a simple switch set to select the KAM at the start of the system operation (and after events requiring re-initialization), until enough signal history $[Y_{k-p}, \ldots, Y_{k-1}]$ is generated in unit 420 to enable COMPLETE operations. After this occurs, preselector 410 can be set to select the COMPLETE. More complex DF implementations that can select among multiple choices of COMPLETEs 10a-10n and KAMs 405a-405n can be obtained which employ analyses of the input $X_k$ as was described above in the description of preselector 410.

Decision-Later (DL): The DL embodiment makes all the decisions regarding the choice of a model or models in the postselector 430, instead of in preselector 410. The DL strategy allows several possible embodiments. The most basic DL strategy computes candidate models for all available method options in COMPLETE/KAM 415 and then postselector 430 selects among all the method options by comparing results obtained from their respective best models, using one or more evaluation metrics for assessing model quality and other performance measures that were given above under the description of postselector 430. This strategy may be used, for example, when the goal is to choose the best overall performing model according to some predetermined set of criteria. More complex DL strategies can consist of several iterative steps, each step involves generating multiple candidate models in COMPLETE/KAM 415 and evaluating results from these models in postselector 430, until the desired performance is obtained. This DL strategy may be used, for example, when the evaluation criteria involve trade-offs, for example a criterion to find the COMPLETE/KAM model that provides the lowest bit rate while meeting or exceeding a preset requirement for model quality. In this example, the model providing the lowest bit rate can be found first using above methods, and if its output quality does not meet the desired requirement, the process is repeated for the next lowest bit rate model, until the model of desired quality is reached.

The iterative DL embodiment can incorporate more complex logic based on known decision making protocols. For example, the outcome from one iterative step may be evaluated and, based on the results, a set of completely different COMPLETEs 10 or KAMs 405 from the set that was used in the previous step may be chosen for the next iteration by postselector 430. For example, postselector 430 may switch the methodology used from a COMPLETE 10 to a KAM 405 based on the outcome of the evaluation from a given iteration. Further, postselector 430 can direct such new model to be estimated for the signal derived from the original input frame $X_k$ or, alternatively, to be estimated for the residual error obtained from a model evaluated in one of the previous iterations. The iterative process can terminate once a predetermined number of iterations have been completed. Alternatively, postselector 430 can make the decision to terminate iterations once it finds the model that satisfies the preset criteria.

Mixed-Decision (MD): The MD embodiment can use both the preselector 410 and the postselector 430 to combine attributes of the DF and DL strategies. In an MD embodiment, preselector 410 can select a set of potential methods to be evaluated for each frame, rather than specifying a single method as done in the DF embodiment. Unit 430 can accomplish further selection from among the chosen models after they have been evaluated. Thus, 410 can be used to narrow down the choice of COMPLETEs 10 and KAMs 405 in COMPLETE/KAM Module 415 that need to be considered for a given frame. At the same time, when appropriate, postselector 430 can change this determination after the chosen models have been evaluated and choose another model not originally selected by preselector 410.

It should be appreciated that the strategies described above represent a few basic system implementation options from which an infinite set of possible embodiments can be developed that combine COMPLETEs and KAMs in various ways.

Decoding

In the above COMPLETE/KAM embodiments the decoder appraises the received model identifier code and reconstructs the output signal $Y_k$ accordingly, using the method that corresponds to the one used to encode $X_k$. Such a method used by the coder may be a COMPLETE or a KAM, or a combination of a COMPLETE and/or KAMs. Each part of the signal that was encoded by a KAM is decoded using the known decoding method for that KAM. Each part of the signal that was encoded by a COMPLETE is decoded using the corresponding COMPLETE decoding method described in Mode 1. The restored frames are accumulated in a storage unit of the decoder in a way that mirrors the accumulation of the restored frames in storage 420 on the coder side, and are used in restoring the future frames as needed.

Mode 3: A Speech Coder/Decoder

Figure 5:
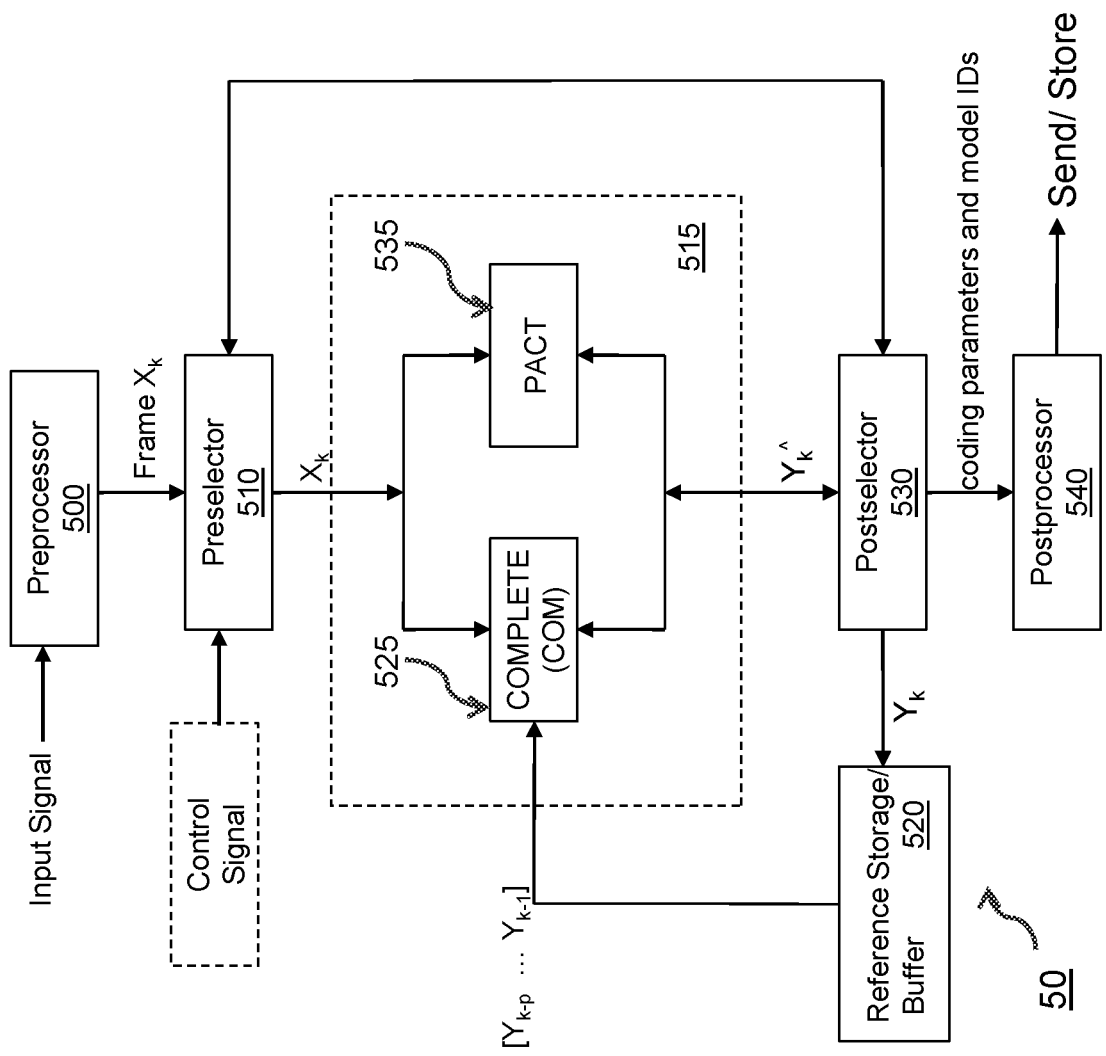
FIG. 5 illustrates an exemplary a block diagram depicting an example of a speech analysis (encoding) system utilizing a multimodal COMPLETE/PACT implementation, in accordance with an embodiment of the present invention.

Mode 3 provides a specific example of some of the embodiments discussed in Modes 1 and 2. FIG. 5 illustrates an exemplary block diagram depicting an example of a speech analysis (encoding) system utilizing a multimodal COMPLETE/PACT implementation, in accordance with an embodiment of the present invention. FIG. 5 shows a block diagram of the essential portion of a speech coder 50 that is capable of producing toll quality speech at bit rates comparable to those of modern codecs and which is implemented using the mixed COMPLETE/KAM strategy described in Mode 2 of this invention. To make it easier to illustrate of some of the key points, Mode 3 uses the Complete Oscillator (COM) part of the COMPLETE model. The COM part of the model uses references derived only from the data history and the current frame and does not use external references. For the sake of simplicity of the description, the model used in Mode 3 will be referred to as COM. The speech coder in FIG. 5 includes a preprocessor module 500; preselector unit 510, which controls the initialization process; and COM/PACT encoding module 515, which contains one COM estimation unit 525 and one KAM estimation unit 535 which implements the Pulsed Autoregressive Compensator (PACT) method described in detail below. Speech coder 50 can further include a storage unit 520 which contains restored earlier inputs $[Y_{k-p}, \ldots, Y_{k-1}]$ that can be accessed by the COM 525; and a postselector 530, which controls the model selection process in the regular (non-initialization) mode and which initiates the output process after the 'best' model is found by routing the relevant information described below to unit 520 and to the postprocessor 540. The postprocessor 540 operates the same as postprocessor 440 of FIG. 4, described in Mode 2, and therefore its description is omitted.

The preprocessor 500 in FIG. 5 processes input data using the same general methodology described for the preprocessing module 120 described above for Mode 1 (See FIG. 1), but adapted to the speech coding application. The input data is sampled, if analog, and windowed to create a frame using one of the windows from the existing art, with common choices being Hamming, Hann or Kaiser windows. The windowing operation may be applied to create frames of input data that overlap their preceding input frame by some fixed number of data points. Typically, the frames are also filtered to remove noise using one of many known methods. Windows spanning from 5 milliseconds (ms) to 40 ms are common in speech coding. In some embodiments, Mode 3 uses 20 ms triangular windows and 50% frame overlap. Each created frame can be outputted by the preprocessor 530 to preselector 510.

Preselector 510 supplies the current input frame to either the COM 525 or the PACT 535, and this controls which model is initially use in COM/PACT module 515. Operations in preselector 510 follow the general description provided for the initialization process in preselector 410 in Mode 2, but with some differences. Specifically, preselector 510 switches to an 'initialization' mode at the start of the operation or after it detects a break in the input signal. In the given implementation, unit 510 remains in 'initialization' mode until enough frames have been accumulated in unit 520 to capture what is expected to be the maximum time span of one pitch period. For example, in coding speech spoken in standard American English, it is typically sufficient to capture 32 ms of continuous speech in the frames in unit 520. Other considerations described in Mode 1 can also influence the number of frames that are being accumulated in storage unit 520. After accumulation is completed, unit 510 can switch to 'regular' mode. While in 'initialization' mode, unit 510 can activate the PACT unit 535 in module 515 by inputting to it the current input frame, to initiate modeling of this frame. While in the 'regular' mode, preselector 510 activates the COM unit 525 in COM/PACT module 515 by inputting to the COM 525 the received frames.

In some embodiments, COM/PACT module 515 in FIG. 5 can contain a COM 525 which estimates the linear 4-delay COM of the form shown in Eq. (2), and a PACT 535 which estimates an autoregressive linear predictor model described below. In the presented embodiment, the $8^{th}$ order autoregressive linear predictor model is used. Alternative embodiments can use COM 525 with a different number of delays and nonlinear function forms of COM and as well as different orders of the PACT 535 and different KAM in place of PACT. Estimation of the COM is performed in the COM 525 using the following embodiment of the general COM estimation procedure described in Mode 1 above. First, the set of candidate model outputs $\{\hat{Y}_k[COM_j], j=1, \ldots, J\}$ is computed for all possible sets of parameters quantized as described below. As in the descriptions above, the superscript $\hat{\phantom{x}}$ is used here to indicate a candidate value, the notation [ ] indicates the method being used to compute the given variable, and the subscript j is the index used to indicate the individual candidate parameter sets. The quality of each candidate model $\hat{Y}_k[COM_j]$ can then be evaluated using the perceptually weighted error (PWE) metric of Eq. (7) above, and the parameter values which yield the minimum PWE are identified as those providing the optimal model and these parameters are supplied to postselector 530, along with the corresponding output $Y_k[COM]$.

Estimation of the PACT model can be performed in the PACT 535 as follows. In several embodiments, an autoregressive linear predictor model of order 8 is estimated, given by:

$$X_k = \sum_{u=1}^{8} b_u X_u(z) + E_k, \qquad (9)$$

where $X_k$ as before indicates an input sequence of some length L, $X_u(z)$ is a length L block of data with latency z, which means that the block starts z samples prior to the last point in $X_k$, $E_k$ is the modeling error known as the prediction error, and $b_u$ represents coefficients that are found by minimizing $E_k$ using, for example, the Levinson-Durbin algorithm or some other method according to the prior art. The input is regenerated from the estimated parameters according to Eq. (9), where $E_k$ is commonly approximated as shown in Eq. (10). The approximation, denoted $R_k$, is computed as a combination of scaled, time-shifted pulses that are represented by Dirac delta functions as $$R_k = \sum_{v=1}^{P} c_v \delta_{p(v)}, \qquad (10)$$

where: $\delta_{p(v)}$ denotes a Dirac delta function with amplitudes 1 at a point p(v) within the current frame and zero otherwise;
p(v) indicates the position of pulse v within the current frame;
$c_v$ indicates the gain for pulse v; and,
P is the number of pulses used in the approximation, with P=8 in the given embodiment.

The candidate parameter sets for the PACT model consist of the pulse positions $\{p_v\}$ and the coefficients $\{c_v\}$, which can be generated using a number of methods. One option is to adapt the same method that is employed to generate the COM parameters in this mode. In this case, pulse positions $\{p_v\}$ can be chosen the same way as the delays $\{d_i\}$, while coefficients $\{c_v\}$ can be computed the same way as the $\{a_i\}$ in Eq. (3). Other basic parameter generation methods can also be used without diminishing the claims made in this invention. The PACT model parameters can also be quantized, for example as described below, and the quality of the candidate PACT models can be evaluated using the same metric as in the evaluation of candidate COMs described above. Specifically, $\{\hat{Y}_k[PACT_j], j=1, \ldots, T\}$ representing the synthesized results from the candidate PACT models are found and used to compute the PWE. The parameter values which yield the minimum PWE are selected as the ones provide the optimal model.

The parameters of the COM and the PACT models can be quantized in their respective units in COM/PACT module 515. The following embodiment assumes a narrow-band speech coder with input being sampled at an 8 kHz rate. In this case, the 20 ms input frames can contain 160 data points (L=160), which translates into 256 possible delay values for the COM and 160 pulse locations for the PACT model, both sets of values being positive integers. Both sets can be quantized directly using 8 bits. To reduce the number of bits used, this embodiment of Mode 3 can use the following known method of partitioning the delays and pulse locations into the interleaved subsets.

The delays can be partitioned into subsets containing 64 entries, and individual positions within each subset are represented using 6 bits. The PACT pulse locations are partitioned into subsets containing 32 entries, and individual positions within each grouping are represented using 5 bits. The COM coefficients $\{a_1\}$ are quantized to 12 bits using one of the known vector quantization methods. Thus, the total number of bits used in the COM code in this embodiment is (6*4)+12=36 bits per frame. The coefficients of the PACT linear predictor model can be converted to line spectral frequencies, as is standard to the art, and can be quantized using known split vector quantization methods. The results are then divided into two sub-vectors of 4 frequencies each and 11 bits is used to encode each sub-vector, resulting in a total of 11+11=22 bits to represent the coefficients. The weights of the pulses in the PACT model are quantized to 13 bits using one of the known vector quantization methods, which can be the same method that is used to quantize the COM coefficients. The total number of bits used to represent the PACT in this example is 22+(5*8)+13=75 bits per frame.

The operating mode of the coder controls the sequence of functions performed in postselector 530. In the 'initialization' mode, postselector 530 receives the quantized parameter set for the optimal PACT model and initiates the process of outputting the code, which will be described below, while the system 50 advances to process the next frame. In the 'regular' mode, postselector 530 receives from module 515 the synthesized output $Y_k[COM^*]$ obtained from the best candidate COM model, along with the corresponding to it quantized parameter set, and computes the Signal-to-Noise Ratio (SNR) metric given in Eq. (5), using $Y_k[COM^*]$. The superscript * denotes the optimal model for which the given variable is obtained. If $SNR[COM^*]$ is less than some predetermined quantity (e.g. 1 dB is used in the embodiment here), it is taken as an indication that there is insufficient redundancy in the signal and the PACT model should be used to encode the frame. In this case, postselector 530 prompts preselector 510 to input $X_k$ to the PACT unit in COM/PACT module 515 which initiates PACT estimation. Otherwise, postselector 530 supplies the residual error $E_k = X_k - Y_k[COM^*]$ to the PACT unit in COM/PACT module 515 which initiates PACT estimation.

After PACT 535 receives a frame containing either the input $X_k$ or the residual error entries $E_k$, the second model estimation is performed, where the PACT model is estimated the same way as was already described above, treating the received frame in each case as the input to be modeled. After the optimal PACT is found in the current iteration, the corresponding synthesized output $Y_k[PACT^*]$, if the input $X_k$ was modeled, or $Y_k[COM^*+PACT^*]$, if the residual error $E_k$ was modeled, along with the corresponding quantized parameter sets are supplied by the PACT 535 to postselector 530 and are used to compute the Log-spectral distance (LSD) metric given by Eq. (6). In the case where the input $X_k$ was modeled in the second iteration, postselector 530 initiates the process of outputting the code, which will be described below, while the system advances to process the next frame. Otherwise, the LSD metric is computed for both synthesized outputs $Y_k[COM^*]$ and $Y_k[COM^*+PACT^*]$. If the difference between the two is less than some threshold value, for example $LSD[COM^*]-LSD[COM^{**}+PACT^*]$ <0.5 dB used in this embodiment, the COM 525 is chosen as the final model, otherwise, PACT 535 is chosen. In both cases, postselector 530 initiates the process of outputting the code, as described below, while the system advances to process the next frame $X_{k+1}$.

The process of outputting the code in postselector 530 consists of supplying the chosen parameters and the model identifier code to the postprocessor 540. Further, as part of the output process, postselector 530 supplies to storage 520 the signal synthesized from the chosen parameters, which has typically been computed in the process of model identification, or, if not, postselector 530 can initiates that computation.

The described basic embodiment produces toll-quality speech in noise-free testing conditions at an average of 9.77 kilobits per second (kbps). The overall performance of this coder, in terms of both bit rate and perceptual quality, is in between the current state of the art G.729 and AMR coders operating in their highest quality modes. The basic embodiment used in the current Mode provides an example, chosen for the sake of simplicity and clarity of the presentation. Variations on the parameters specified above are, without limitation, also covered by the invention. Further, the coder performance can be improved from the baseline described here by implementing various optimization options based on the principles described in Modes 1 and 2.

Speech Restoration at the Decoder

For Mode 3, the speech frames are reconstructed at the decoder using decoding methods of Modes 1 and 2 described above.

Those skilled in the art will readily recognize, in light of and in accordance with the teachings of the present invention, that any of the foregoing steps and/or system modules may be suitably replaced, reordered, removed and additional steps and/or system modules may be inserted depending upon the needs of the particular application, and that the systems of the foregoing embodiments may be implemented using any of a wide variety of suitable processes and system modules, and is not limited to any particular computer hardware, software, middleware, firmware, microcode and the like. For any method steps described in the present application that can be carried out on a computing machine, a typical computer system can, when appropriately configured or designed, serve as a computer system in which those aspects of the invention may be embodied.

Figure 6:
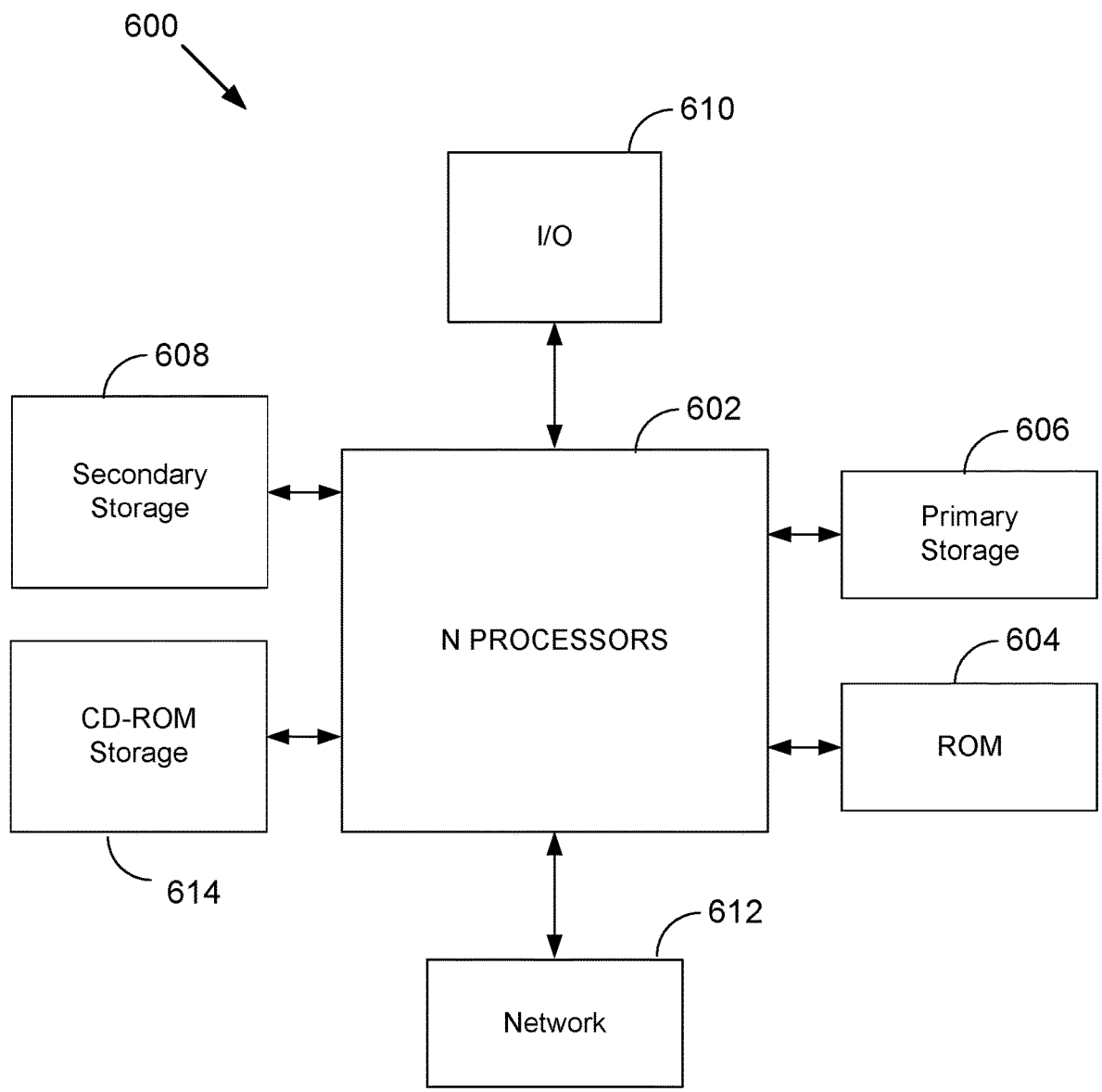
FIG. 6 illustrates a typical computer system that, when appropriately configured or designed, can serve as a computer system in which the invention may be embodied.

FIG. 6 illustrates a typical computer system that, when appropriately configured or designed, can serve as a computer system in which the invention may be embodied. The computer system 600 includes any number of processors 602 (also referred to as central processing units, or CPUs) that are coupled to storage devices including primary storage 606 (typically a random access memory, or RAM), primary storage 604 (typically a read only memory, or ROM). CPU 602 may be of various types including microcontrollers (e.g., with embedded RAM/ROM) and microprocessors such as programmable devices (e.g., RISC or SISC based, or CPLDs and FPGAs) and unprogrammable devices such as gate array ASICs or general purpose microprocessors. As is well known in the art, primary storage 604 acts to transfer data and instructions uni-directionally to the CPU and primary storage 606 is used typically to transfer data and instructions in a bi-directional manner. Both of these primary storage devices may include any suitable non-transitory computer-readable media such as those described above. A mass storage device 608 may also be coupled bi-directionally to CPU 602 and provides additional data storage capacity and may include any of the non-transitory computer-readable media described above. Mass storage device 608 may be used to store programs, data and the like and is typically a secondary storage medium such as a hard disk. It will be appreciated that the information retained within the mass storage device 608, may, in appropriate cases, be incorporated in standard fashion as part of primary storage 606 as virtual memory. A specific mass storage device such as a CD-ROM 614 may also pass data uni-directionally to the CPU.

CPU 602 may also be coupled to an interface 610 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 602 optionally may be coupled to an external device such as a database or a computer or telecommunications or internet network using an external connection as shown generally at 612, which may be implemented as a hardwired or wireless communications link using suitable conventional technologies. With such a connection, it is contemplated that the CPU might receive information from the network, or might output information to the network in the course of performing the method steps described in the teachings of the present invention.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Having fully described at least one embodiment of the present invention, other equivalent or alternative methods of signal coding and decoding according to the present invention will be apparent to those skilled in the art. The invention has been described above by way of illustration, and the specific embodiments disclosed are not intended to limit the invention to the particular forms disclosed. The invention is thus to cover all modifications, equivalents, and alternatives falling within the spirit and scope of the following claims.

Claim elements and steps herein may have been numbered and/or lettered solely as an aid in readability and understanding. Any such numbering and lettering in itself is not intended to and should not be taken to indicate the ordering of elements and/or steps in the claims.

The invention claimed is:

1. A method for encoding an audio signal, the method comprising:
   (a) obtaining a current frame from an audio signal;
   (b) identifying a best restored frame from a set of restored frames, wherein the set includes: (i) a restored frame generated by operating on one or a plurality of data blocks obtained from stored reference data and (ii) a restored frame generated using a process of generating a point of the restored frame as a combination of one or a plurality of data points obtained from a set containing the stored reference data and a partially generated said restored frame; and
   (c) encoding a parameter indicating data used in generating the best restored frame.

2. The method of claim 1, wherein the stored reference data are derived from one or more sources from a set consisting of: frames synthesized from audio frames other than the current frame, predetermined waveforms, and waveforms inferred based on characteristics of the current frame.

3. The method of claim 1, wherein said identifying process includes utilizing one or a plurality of metrics evaluating one or a plurality of characteristics from a set including: accuracy, stability, perceptual quality, bitrate efficiency, and computational efficiency.

4. The method of claim 1, wherein at least step (b) of claim 1 is included in a codec comprising one or more encoding methods.

5. The method of claim 4, in which the audio signal is a speech signal.

6. A method for decoding an encoded audio signal, the method comprising: receiving one or more synthesis parameters; synthesizing an output, wherein said synthesizing operation is selected, in accordance with the synthesis parameters, from a set including: (i) forming the output from one or more data blocks obtained from stored reference data and (ii) synthesizing the output using a process of synthesizing a point of the output as a combination of one or a plurality of data points obtained from a set containing: the stored reference data and a partially synthesized said output.

7. The method of claim 6, wherein the method of claim 6 is a part of a codec comprising one or more decoding methods.

8. The method of claim 7, in which the audio signal is a speech signal.

* * * * *